United States Patent
Loh et al.

(10) Patent No.: US 7,385,864 B2
(45) Date of Patent: Jun. 10, 2008

(54) SRAM STATIC NOISE MARGIN TEST STRUCTURE SUITABLE FOR ON CHIP PARAMETRIC MEASUREMENTS

(75) Inventors: Wah Kit Loh, Richardson, TX (US); Donald James Redwine, Canton, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/519,312

(22) Filed: Sep. 12, 2006

(65) Prior Publication Data

US 2008/0062746 A1    Mar. 13, 2008

(51) Int. Cl.
*G11C 7/00* (2006.01)

(52) U.S. Cl. ............... 365/201; 365/154; 365/200; 365/206

(58) Field of Classification Search ............ 365/154, 365/201, 206, 200
See application file for complete search history.

(56) References Cited

U.S. PATENT DOCUMENTS 6,081,464 A * 6/2000 Marr .................... 365/201

OTHER PUBLICATIONS

"Static-Noise Margin Analysis of MOS SRAM Cells", Evert Seevinck, Frans J. List and Jan Lohstroh, IEEE Journal of Solid-State Circuits, vol. SC-23, No. 5, Oct. 1987, pp. 748-754.

\* cited by examiner

*Primary Examiner*—David Lam
(74) *Attorney, Agent, or Firm*—Jacqueline J. Garner; W. James Brady, III; Frederick J. Telecky, Jr.

(57) ABSTRACT

A set of memory cell test structures and a method for assessing of the static noise margin (SNM) of a memory cell or cells, using discrete point measurement structures provided either on-chip or within the scribe lines. A set of memory structures may comprise first and second test structures, individually comprising a memory cell, having one or more left and right half-bit test structures having hard-wired connections between select nodes of each memory cell half-bit and one or more voltage supplies. The half-bits of the first test structure are configured for measuring respective left and right standby SNM values, and the half-bits of the second test structure are configured for measuring respective left and right cell ratio values at respective output nodes of the structures, using applied supply voltages for on-chip assessment of the static noise margin of the memory cells.

29 Claims, 14 Drawing Sheets

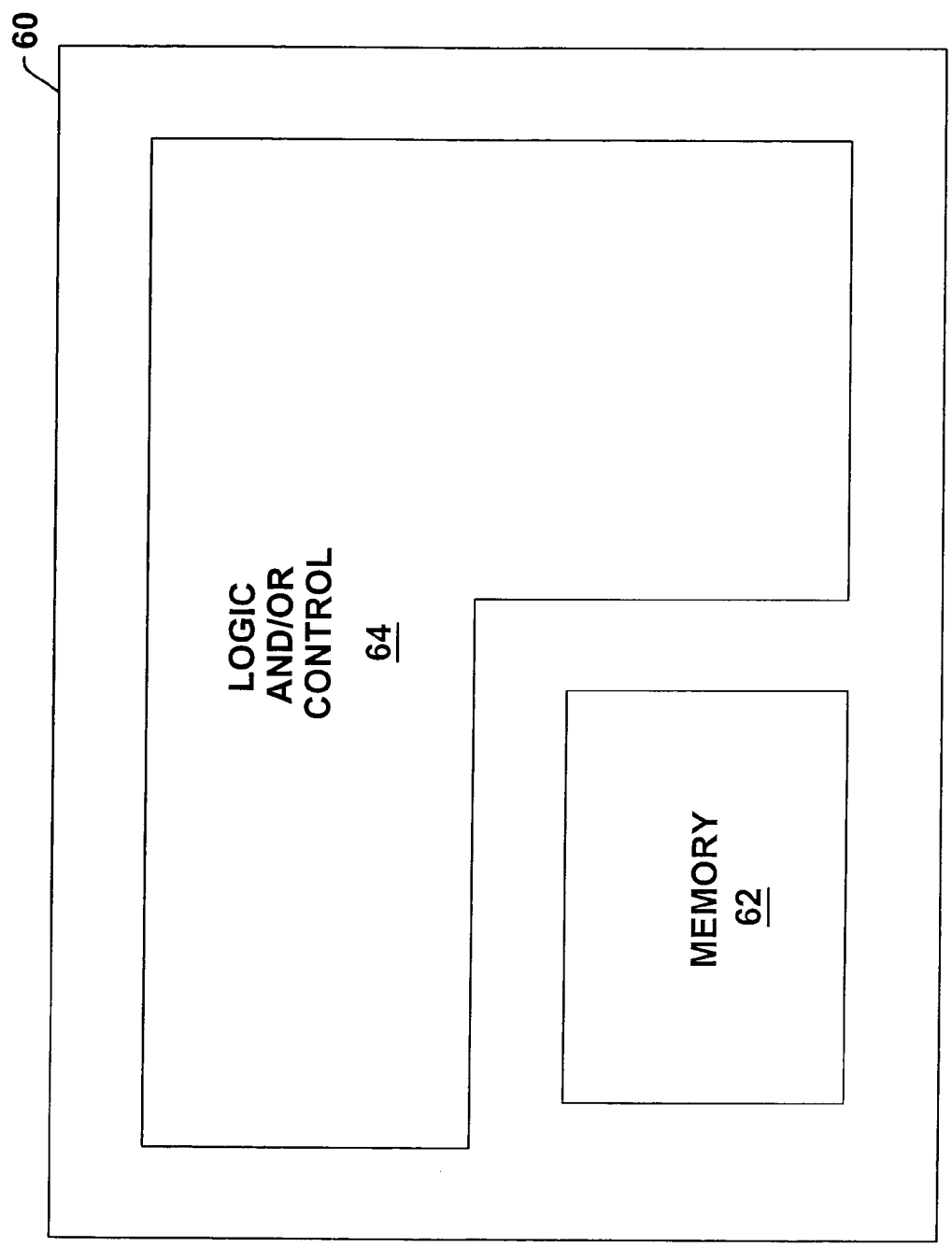

US 7,385,864 B2

SRAM STATIC NOISE MARGIN TEST STRUCTURE SUITABLE FOR ON CHIP PARAMETRIC MEASUREMENTS

FIELD OF INVENTION

The present invention relates generally to integrated circuit devices, and more particularly to methods and test structures suitable for early and massive on-chip assessment of the static noise margin (SNM) of a static random access memory (SRAM) memory cell or array of such cells of an integrated circuit device without the time consuming acquisition and post processing of voltage transfer "butterfly curves" to derive SNM, but rather by using discrete point measurement structures provided either on-chip or within the scribe lines.

BACKGROUND OF THE INVENTION

Memory tests are devised to uncover faults with storage cells and the access to these storage cells arising in part from improper design, lack of design margins or processing deficiencies. Generally, these tests are designed to be extensive and exhaustive to ensure that no bit defects, either hard defects or intermittent failures find their way into the field.

Semiconductor memories can, for example, be characterized as volatile random access memories (RAMs) or non-volatile read only memories (ROMs), where RAMs can either be static (SRAM) or dynamic (DRAM) differing mainly in the manner by which they store a state of a bit. In SRAM, for example, each memory cell includes transistor-based circuitry that implements a bistable latch, which relies on transistor gain and positive (e.g., reinforcing) feedback so that it can only assume one of two possible states, namely on (state 1) or off (state 2). The latch can only be programmed or induced to change from one state to the other through the application of a voltage or other external stimuli. This arrangement is desirable for a memory cell since a state written to the cell will be retained until the cell is reprogrammed.

SRAM is typically arranged as a matrix of thousands of individual memory cells fabricated in an integrated circuit chip, and address decoding in the chip allows access to each cell for read/write functions. SRAM memory cells use active feedback from cross-coupled inverters in the form of a latch to store or "latch" a bit of information. These SRAM memory cells are often arranged in rows and columns so that blocks of data such as words or bytes can be written or read simultaneously. Standard SRAM memory cells have many variations.

SRAM memory arrays come in all sizes from arrays having tens of cells, to arrays having billions of cells. SRAMs may also be provided as memory devices dedicated purely to memory storage operations, or as a memory array that is embedded within an integrated circuit (IC) that carries out one of a variety of other control and/or processing functions. Such embedded memory array applications may include, for example, an automotive engine controller or a communications IC, wherein the embedded SRAM memory array may store set-up parameters, coordinates, initial conditions, or other variables used by the IC. Accordingly, embedded SRAM memory array applications usually require smaller arrays than those dedicated purely to memory storage.

The basic CMOS SRAM cell generally includes two n-type or n-channel (nMOS) pull-down or drive transistors and two p-type (pMOS) pull-up or load transistors in a cross-coupled inverter configuration, which act as a bistable latch circuit, with two additional nMOS select or pass-gate transistors added to make up a six-transistor cell (a 6T cell). Additionally, application specific SRAM cells can include an even greater number of transistors. A plurality of transistors are utilized in SRAM requiring matched electrical characteristics to provide predictable cell switching characteristics, reliable circuit performance, and minimize array power dissipation. Accordingly, rapid and effective testing of SRAM cells and SRAM arrays becomes increasingly critical as current scaling trends continue in modern integrated circuits and embedded memory devices.

Static Noise Margin (SNM) is a key SRAM parameter that is a direct measure of how well an SRAM memory cell can maintain its state when it is perturbed by noise or with intrinsic imbalance between the cross coupled inverters and leakage defects within the transistors forming the SRAM bit. An SRAM bit can easily be upset when it is accessed if it is designed with insufficient SNM throughout its operating voltage range. An upset usually occurs when a cell is accessed. Accessed in this context, means that the word line for the bit is raised high for either reading from that bit or for writing to another bit on the same row of the memory array but on a different column of that memory array.

FIGS. 1A and 1B initially illustrate a conventional 6T SRAM cell 1, wherein some of these issues may be described.

FIG. 1A, for example, illustrates a schematic diagram for the conventional differential 6T static random access memory (SRAM) cell 1. SRAM cell 1 comprises a data storage cell, latch, or core cell 2, generally including a pair of cross-coupled inverters, for example, inverter 12 and inverter 14, the latch 2 operable to store a data bit state. As illustrated in FIG. 1A, the bit is stored in the latch 2 at the first and second latch nodes or data nodes N3 and N4, respectively, having a high or "0" state and a low or "1" state, respectively. Cell 1 also comprises a pair of wordline pass transistors 16, 18 to read and write the data bit between the cross-coupled inverters 12, 14 and bitlines BL 30, BL-bar 31, when enabled by wordline 32. FIG. 1B illustrates a simplified version of the cross coupled inverters 12 and 14 connected at data nodes N3 and N4.

Respective inverters 12, 14 comprise a p-type MOS (PMOS) pull-up or load transistors MP1 (20), MP2 (22) and an n-type (nMOS) pull-down or driver transistors MN1 (24), MN2 (26). Pass transistors MN3 (16), MN4 (18) are n-channel as well, which generally supply higher conductance than p-channel transistors. Pass transistors 16, 18 are enabled by wordline WL 32 and accessed by bitlines BL30, BLB 31 to set or reset the SRAM latch 1. FIG. 1A further illustrates that inverters 12, 14 of the SRAM memory cell 1 are connected together to a Vdd drain voltage line Vdd 40 and a Vss source voltage line Vss 50.

The differential 6T SRAM cell 1 comprises six transistors and is termed a 6T full CMOS SRAM cell. In general, SRAM cells are more stable and have better data retention where the respective pMOS (MP1 (20), MP2 (22)) and nMOS (24, 26) transistors are load balanced and matched for the two inverters (12, 14).

Functionally, the outputs of the two inverters provide opposite states of the latch, except during transitions from one state to another. The pass-gate transistors provide access to the cross-coupled inverters during a read operation (READ) or write operation (WRITE). The gate inputs of the pass transistors are typically connected in common to a word line (wordline or WL). The drain of one pass transistor is connected to a bit line (bitline or BL), while the drain of the other pass transistor is connected to the logical complement of the bit line (bitline-bar or BLB).

A WRITE to a 6T cell is enabled by asserting a desired value on the BL and then asserting the WL. Thus, the prior state of the cross-coupled inverters is overwritten with a current value. A READ is enabled by initially precharging both bitlines to a logical high state and then asserting the WL. In this case, the output of one of the inverters in the SRAM cell will pull one bitline lower than its precharged value. A sense amplifier detects the differential voltage on the bitlines to produce a logical "one" or "zero," depending on the internally stored state of the SRAM cell.

However, as dimensions are continually reduced to scale down such devices, the time consumed in testing of memory cells can become a significant issue in the effective assessment of the cell, or the transistors of a cell, particularly in SRAM memory devices requiring matched transistor characteristics.

FIGS. 1A and 1B further illustrate some problematic aspects associated with the reading of an SRAM cell 1, for example, when node N3 has been stored with a "0" state. When the cell is read or accessed, the word line (WL 32) is turned on and the bit line (BL 30/BLB 31) is discharged from an initial pre-charged level at Vdd towards ground through the pass gate MN3 (16). The voltage at N3 rises as the discharge occurs as transistor MN3 (16) and MN1 (24) can be thought of a forming a potential divider. A well designed and well behaved cell would keep N3 as low as possible so that the action of the access on the state of the bit would not perturb any voltage on the bit prior to access in order to avoid upset of the bit state.

However, this desire for maximum stability needs to be balanced with the ability to write to the bit. The more stable a bit is, the more difficult it is to write to it. Conversely, the bit that is easily written to is inherently unstable. The objective of SRAM design is to optimize both read and write operations as much as possible as well as keeping to a small cell area, high read currents, and low standby current. When N3 exceeds the voltage threshold of driver transistor MN2 (26) of the back to back inverter 14, the bit "flips" and the data state is corrupted. In other words, the state of the bit in this example has changed from a zero to a one when the bit was accessed. This would result in a memory failure.

Often SRAM memory arrays are put into a lower power mode than standby. This is sometimes referred to as the data retention mode in which the array voltage supply is lowered to a voltage well below the minimum operating voltage specified for the memory. In this way, leakage currents from the memory cells can be further reduced for prolonged battery operation. If a bit is well balanced (left inverter characteristics is nearly the same as the right inverter), the minimum holding or retention voltage can be extremely low, on the order of about 0.2V. However, transistor imbalances and minor leakages will increase this retention voltage substantially to about 0.6V for 1.2V technologies. Hence, it is possible to have data corruption without accessing the memory but by simply going into the retention mode. The SNM of the bit 1 with its word line WL 32 shut off or disabled may be referred to as "standby SNM", herein, and is another important parameter in SRAM design.

It follows, then, that knowing the distribution of SNM of SRAM bits in a memory product provides an accurate forecast of the number of single bit memory failures the product will experience that is related to cell disturb. Much effort is spent in the SRAM memory industry to gain accurate measures of SNM. A prior art industry standard method of obtaining SNM is to measure and plot what is commonly referred to as "Butterfly Curves", as will be discussed and illustrated further in association with FIG. 1G, infra. Butterfly curves are typically obtained by carefully measuring the voltage transfer characteristics (VTC) on each side (left and right side or left and right inverter) of the SRAM bit configured as shown in FIG. 1A. The "butterfly" is formed by mirroring one side of the VTC with respect to a line passing through the origin at 45 degrees from the horizontal axis. The SNM is given by the length of the diagonal of the largest square that can be contained between the curves. If the two inverters (e.g., 12 and 14) are perfectly symmetrical, the squares on the upper and lower part of the curves will be identical. If asymmetry exists, then one will be larger than the other and the SNM is from the lesser of the two diagonals.

Thus, getting to an SNM value requires a relative large number of measurements and a relatively sophisticated algorithm to extract SNM numbers from VTCs. While it is relatively straightforward to measure VTCs at higher voltages, a long measuring time is required at low supply voltages to obtain accurate VTCs. This is because the external measurement probes have large input capacitances that require a considerable amount of time (e.g., milliseconds) to charge. Hence, lower supply measurements require much time per measurement and are usually prohibitive in a production test environment.

Accordingly, it would be desirable to obtain an on-chip parametric memory testing technique that provides an approximation to SNM without obtaining VTCs and the associated time consuming acquisition and post processing in order to provide massive data gathering for statistical analysis, particularly in an SRAM memory device.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Rather, its primary purpose is merely to present one or more concepts of the invention in a simplified form as a prelude to the more detailed description that is presented later.

The present invention is directed to a set of test structures and methods of assessment of the static noise margin (SNM) of a memory cell (e.g., an SRAM cell) or array of such cells of an integrated circuit device, using discrete point measurement structures provided either on-chip or within the scribe lines. The methods of assessment of the SNM of the present invention provides an effective approximation to SNM, without the associated time consuming acquisition and post processing of voltage transfer curves (VTCs) or "butterfly curves" to derive SNM, in accordance with one or more aspects of the present invention. The structures associated with the methods lend themselves to be placed not only within traditional scribe line regions, but also within product chips as well. Such parametric structures that are amenable to being placed on a product chip are called on-chip parametric (OCP) structures.

In one aspect of the present invention, a set of structures or test structures is used for on-chip assessment of the static noise margin of a memory cell of an integrated circuit device. The set of structures comprise: first and second test structures, that individually comprise a memory cell, having one or more half-bits, and left and right half-bit test structures, comprising hard-wired connections between select nodes of each memory cell half-bit and one or more voltage supplies applied to the respective half-bit test structure, wherein the left and right half-bits of the first test structure are configured for measuring respective left and right standby SNM voltage values at an output node using supply voltages applied to the first test structure during on-chip assessment of the static noise margin of the memory cell; and wherein the left and right half-bits of the second test structure are configured for measuring respective left and right cell ratio voltage values at an output node using supply voltages applied to the second test structure during on-chip assessment of the static noise margin of the memory cell of the device.

In another aspect, the structures comprise a memory cell comprising one of a flip-flop, a latch, a register, and a storage element.

In yet another aspect, the structures comprises an SRAM.

In still another aspect, the structures comprise one of a single port, a two port, a dual port, a 6T SRAM, and a multi-port memory cell.

In another implementation of the present invention, the structures further comprise an array of memory cells similar to the memory cell used in the first and second test structures, wherein the test structures are located within the array of memory cells.

In still another aspect, each half-bit test structure comprises a plurality of nodes, comprising an input node, an output node, a wordline node, a bitline node, a source supply node, and a drain supply node.

In another aspect, the plurality of nodes of the test structures are individually connected to a corresponding one of a plurality of device pads.

In yet another aspect, the plurality of nodes of the test structures are further configured to be controlled by one of a built-in self-test circuit, a device pad, a device pin, and an on-chip parametric testing circuit to individually couple one of the plurality of nodes to the controlling circuit for on-chip assessment of the static noise margin of a memory cell.

In another aspect, the output nodes of the test structures are further configured to multiplex the output voltages to a single output bond pad for external measuring and monitoring purposes.

In still another aspect, the test structures are located in one of a scribe line of the wafer, a portion of the die that accommodates on-chip parametric testing, a built-in self-test circuit, and a portion of an array of memory cells.

In one aspect of the present invention, a method of on-chip assessment of the static noise margin of an SRAM cell of a semiconductor device is disclosed, using two or more test structures. In one embodiment of the present invention, the method comprises: applying one or more supply voltages to the test structures, using hard-wired connections between corresponding voltage supplies and select nodes of the test structures, measuring a standby SNM value for a left half-bit and a right half-bit of a first test structure to obtain left and right standby SNM values, measuring a cell ratio value for a left half-bit and a right half-bit of a second test structure to obtain left and right cell ratio values. The method further comprises determining a first difference between the left half-bit standby SNM value and the right half-bit cell ratio value, determining a second difference between the right half-bit standby SNM value and the left half-bit cell ratio value; and determining a smaller one of the first and second difference values, the smaller difference value being proportional to an SNM value of the SRAM cell.

Thus, four single point measurements may be made using the two test structure types with both left and right half-bit sides of the memory cell utilized in the present invention, thereby providing a faster on-chip assessment of the SNM than in a prior art method, and without the use of time consuming butterfly curves.

In another aspect of the method of the present invention, the applying of one or more supply voltages to the test structures, comprises applying source and drain supply voltages to the test structures, using the hard-wired connections between the voltage supplies and select nodes of the test structures.

In yet another aspect of the present invention, the smaller difference value is further proportional to an SRAM bit fail rate of the SRAM cell.

In still another aspect of the present invention, the SRAM memory cell comprises one cell of an array of SRAM cells.

In another aspect of the present invention, each memory cell test structure comprises a left half-bit and a right half-bit, each half-bit further comprising an input node, an output node, a wordline node, a bitline node, a source supply node, and a drain supply node.

In yet another aspect of the present invention, the measuring of the left and right standby SNM values within respective left and right half-bits of the first test structure, comprises shorting the input and output nodes, connecting the wordline and bitline nodes to the source supply node, and measuring the voltage at the output node for the applied source and drain supply voltages.

In still another aspect of the present invention, the measuring of the left and right cell ratio values within respective left and right half-bits of the second test structure, comprises connecting the input, wordline, and bitline nodes to the drain supply node, and measuring the voltage at the output node for the applied source and drain supply voltages.

In this way a set of memory cell testing structures may be used to obtain four or more point measurements of the voltage transfer characteristics of a memory cell, which are used to determine a value that is proportional to the SNM of the SRAM cell of a semiconductor or integrated circuit memory device.

To the accomplishment of the foregoing and related ends, the following description and annexed drawings set forth in detail certain illustrative aspects and implementations of the invention. These are indicative of but a few of the various ways in which one or more aspects of the present invention may be employed. Other aspects, advantages and novel features of the invention will become apparent from the following detailed description of the invention when considered in conjunction with the annexed drawings.

1A, and having a logic and/or control region, such as may be used in accordance with one or more aspects of the present invention.

Figure 1A:
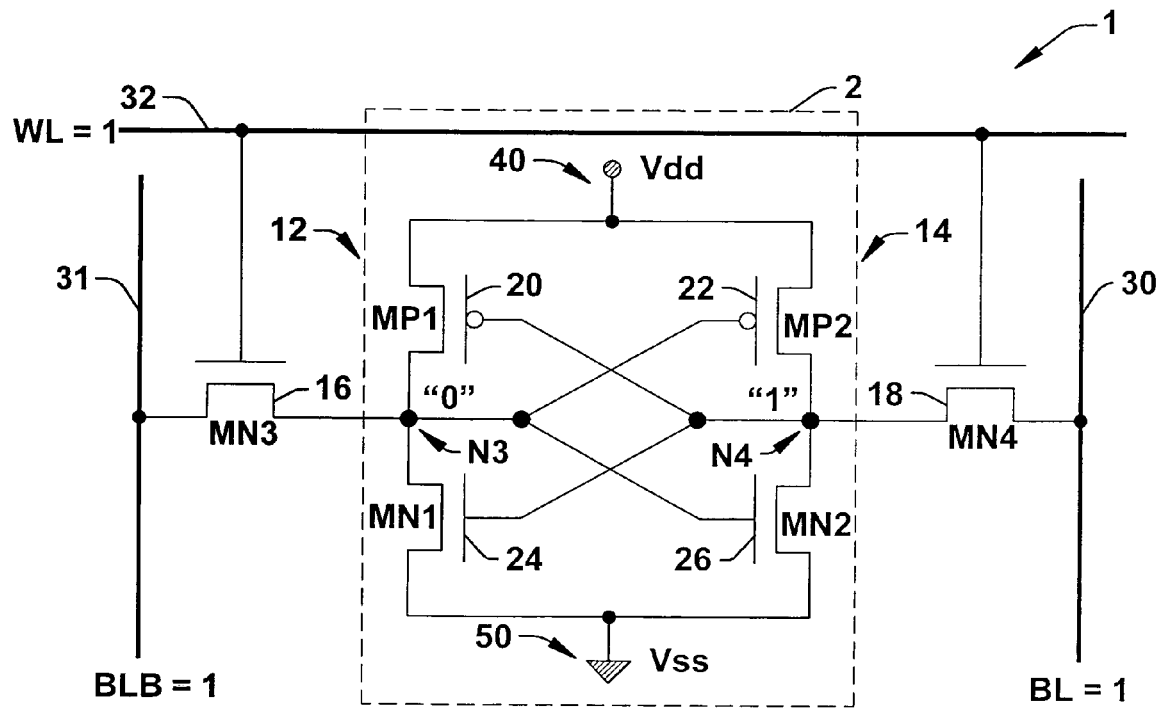
FIG. 1A is a schematic diagram of a conventional 6T static random access memory (SRAM) cell and SRAM core cell having a pair of output data nodes.
Figure 1B:
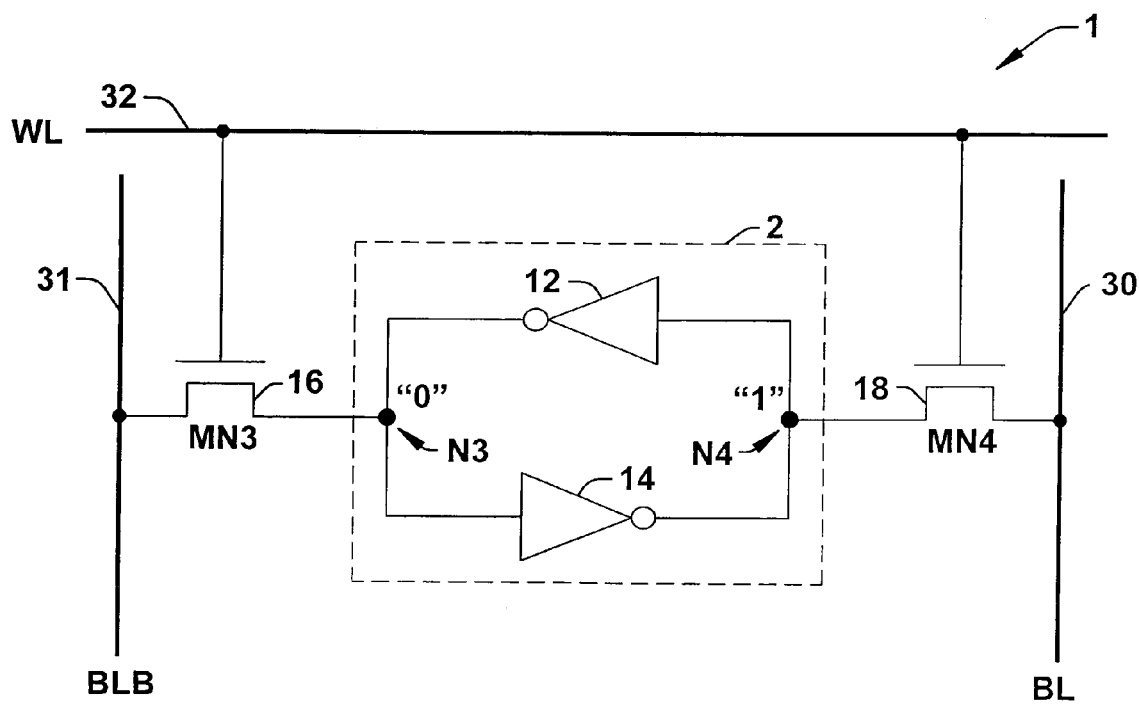
FIG. 1B is a simplified schematic diagram of the conventional 6T static random access memory (SRAM) cell of FIG. 1A, with the core cell represented as a pair of cross-coupled inverters connected to the output data nodes.
Figure 1C:
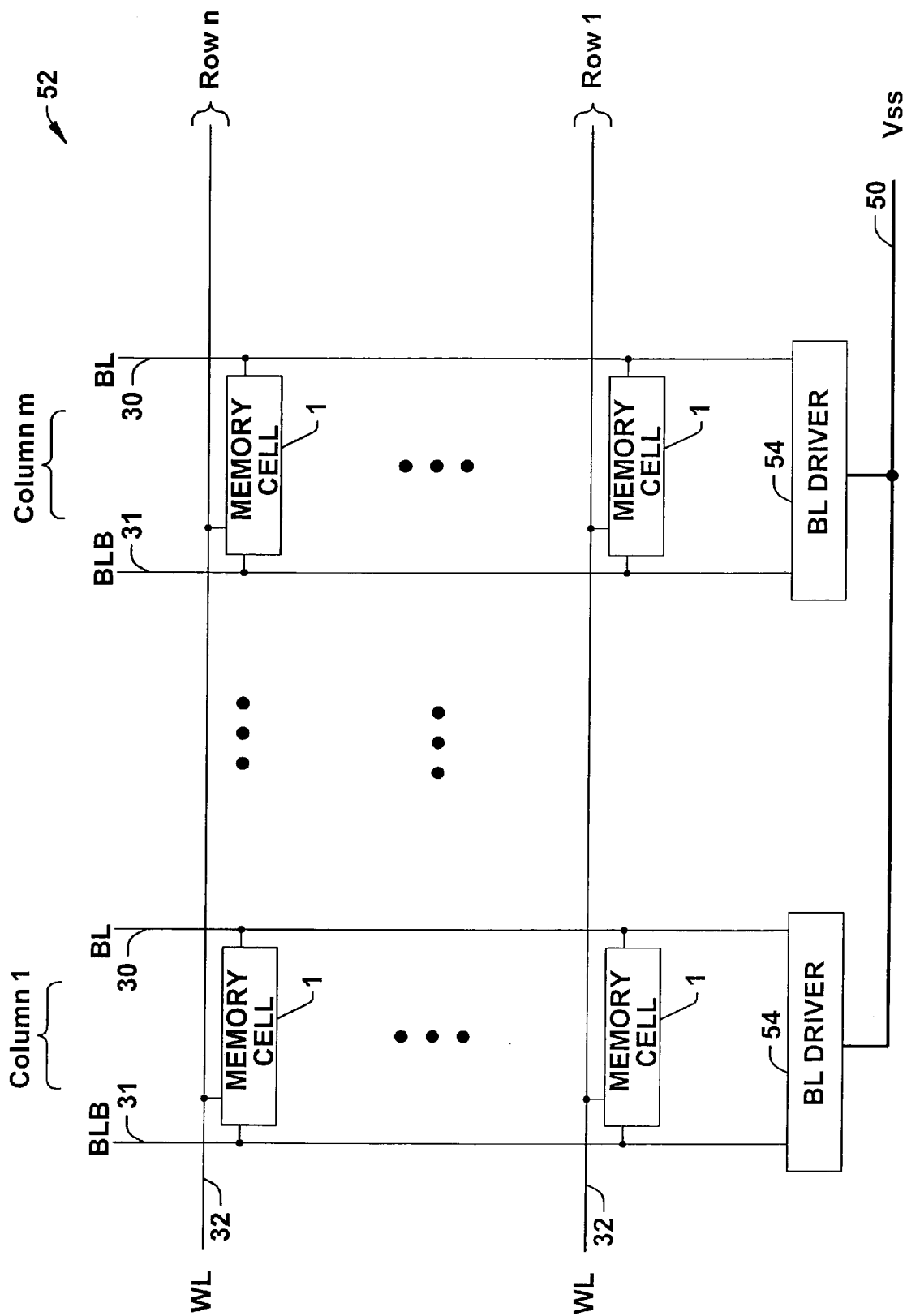
FIG. 1C is a schematic diagram of an exemplary array of memory cells, similar to the SRAM memory cell of FIG. 1A, the array having columns of bitlines and rows of wordlines.
Figure 1E:
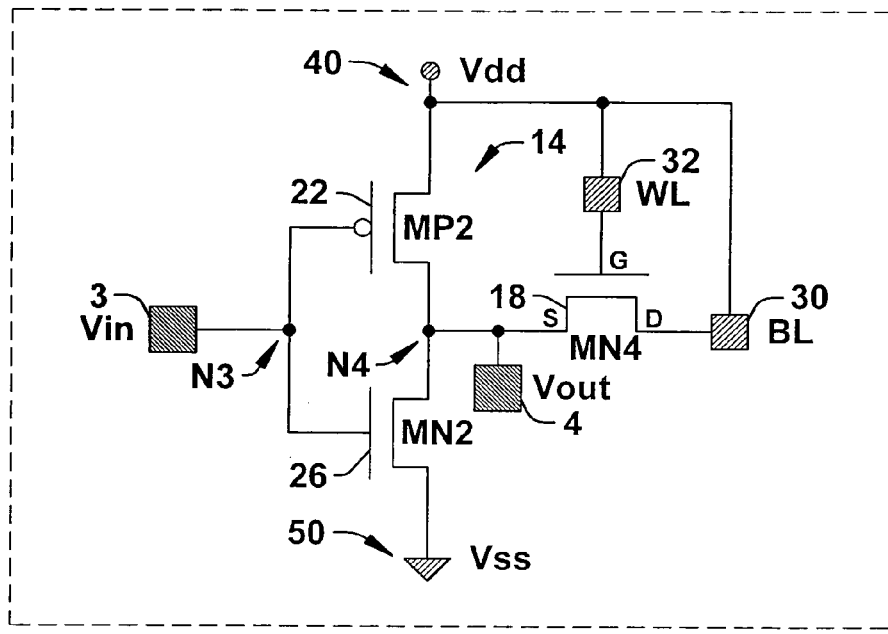
FIG. 1D is a simplified layout diagram of a conventional integrated circuit having an embedded memory region, comprising either a memory test cell or an array of cells such as the static random access memory (SRAM) cell of FIG.

FIG. 1E is a schematic diagram of the right half-bit, representing one of the cross-coupled inverters and corresponding pass gate of a conventional SRAM memory cell such as that of FIG. 1A, the half-bit having input and output data nodes used for input and output measurement of the conventional voltage transfer curves (VTCs) used for determining SNM in a prior art.

Figure 1F:
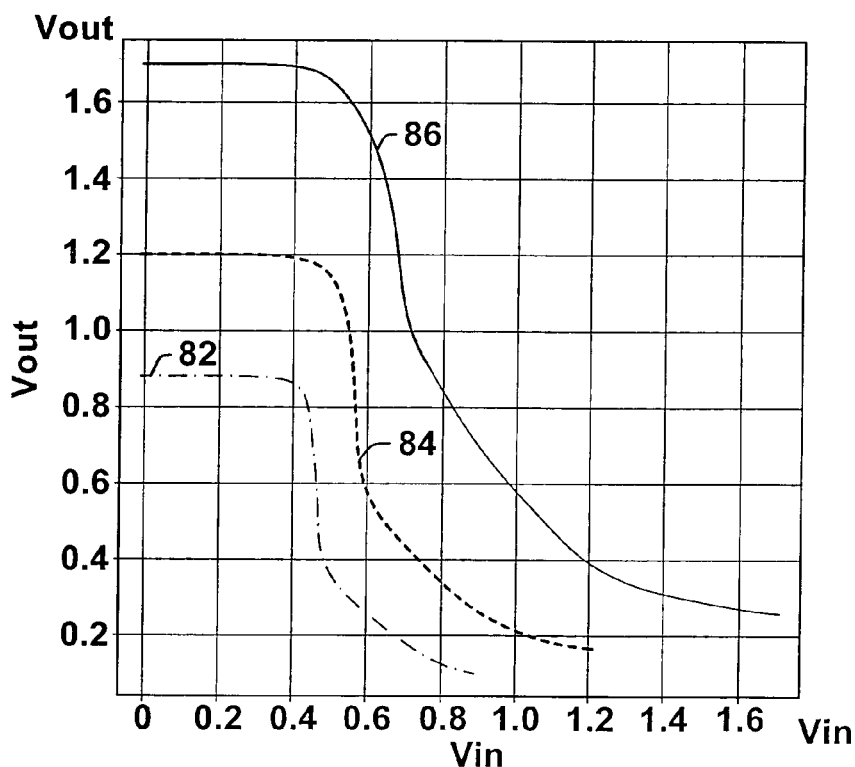

FIG. 1F is a plot of several conventional voltage transfer characteristics (VTCs) of the half-bit cell of FIG. 1E measured at several supply voltage levels, such as may be used to determine SNM in a prior art.

Figure 1G:
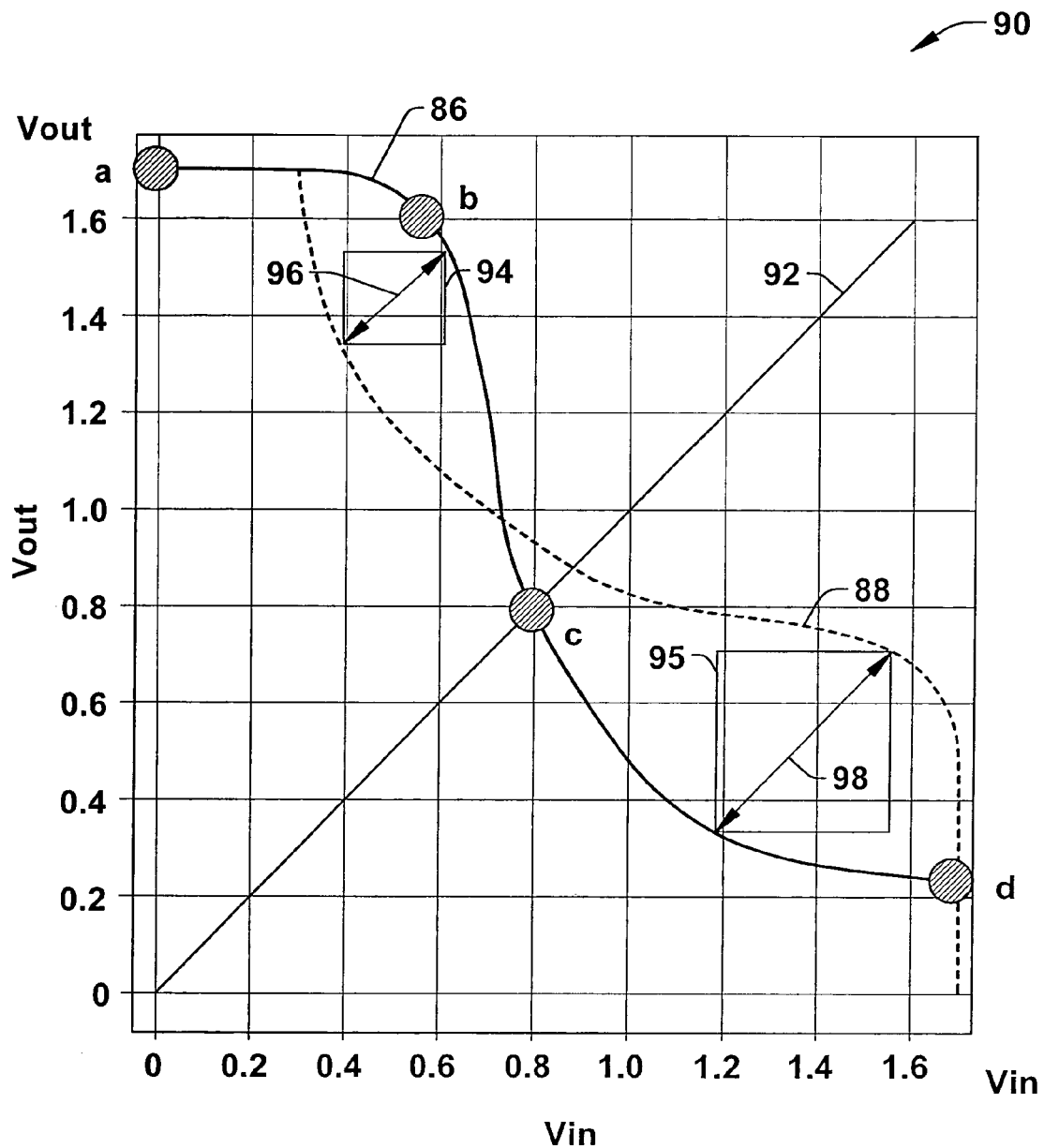

FIG. 1G is a plot of the conventional butter fly curves of the VTCs of the right and left half-bits similar to that of FIG. 1E, such as may be used to manually determine SNM in a prior art.

Figure 2A:
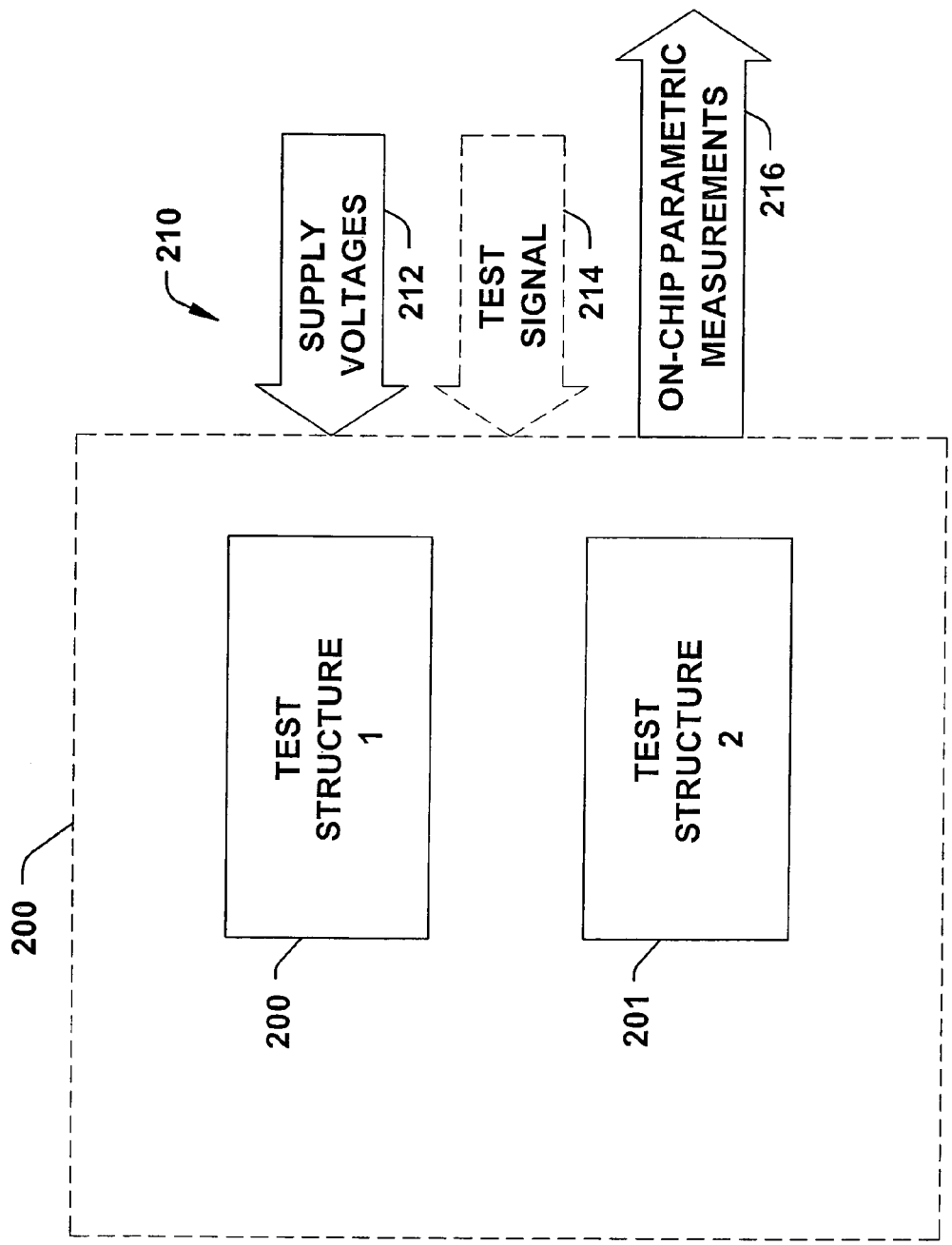

FIG. 2A is a functional block diagram of an exemplary set of memory test structures, the set comprising a first and second type of memory test structures having supply voltages and optionally, test signals applied to select nodes of the test structures, and outputting on-chip parametric measurements for external parametric monitoring the structures used to test and characterize the cells of the memory array in accordance with one or more aspects of the present invention.

Figure 2B:
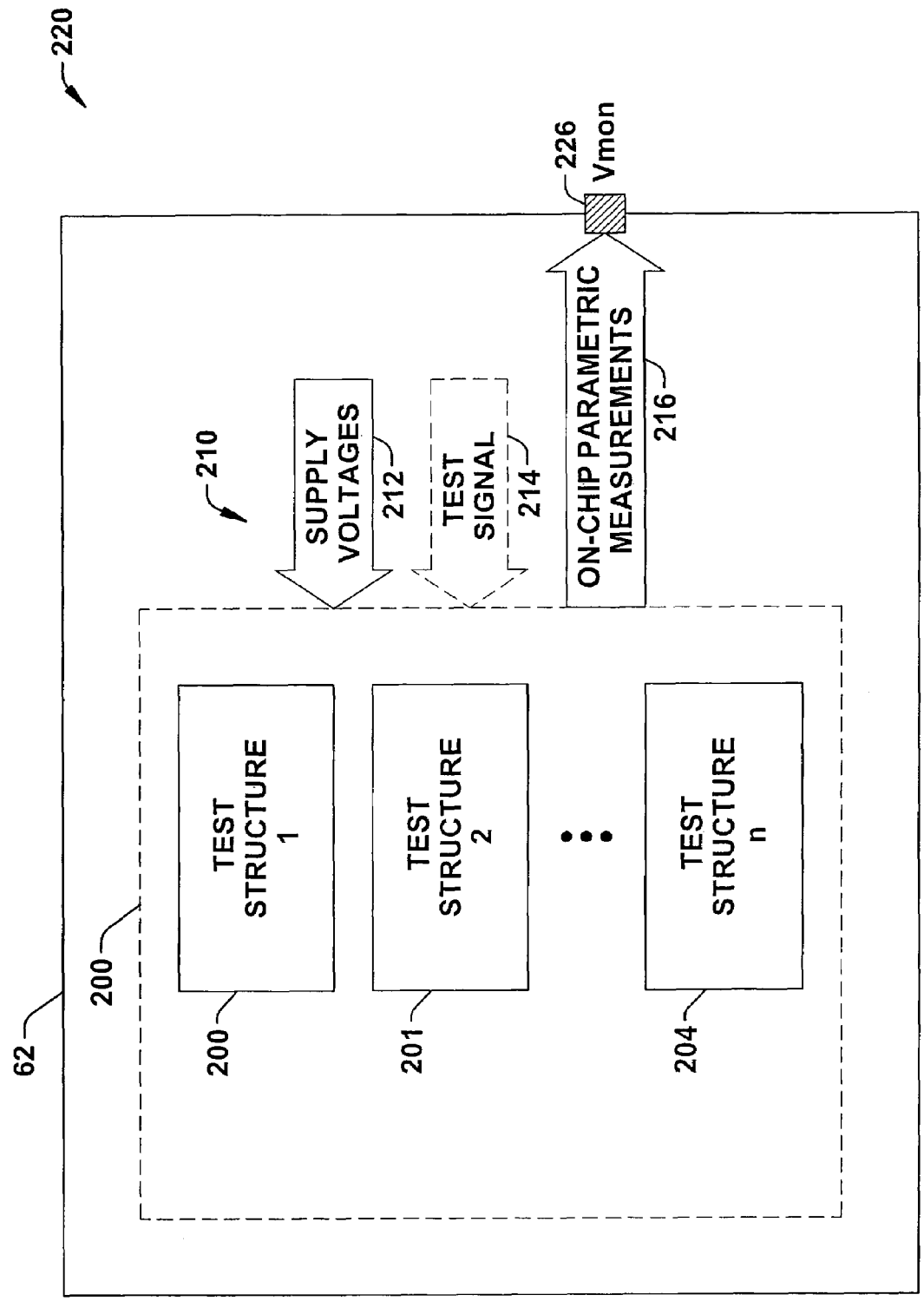
Figure 2C:
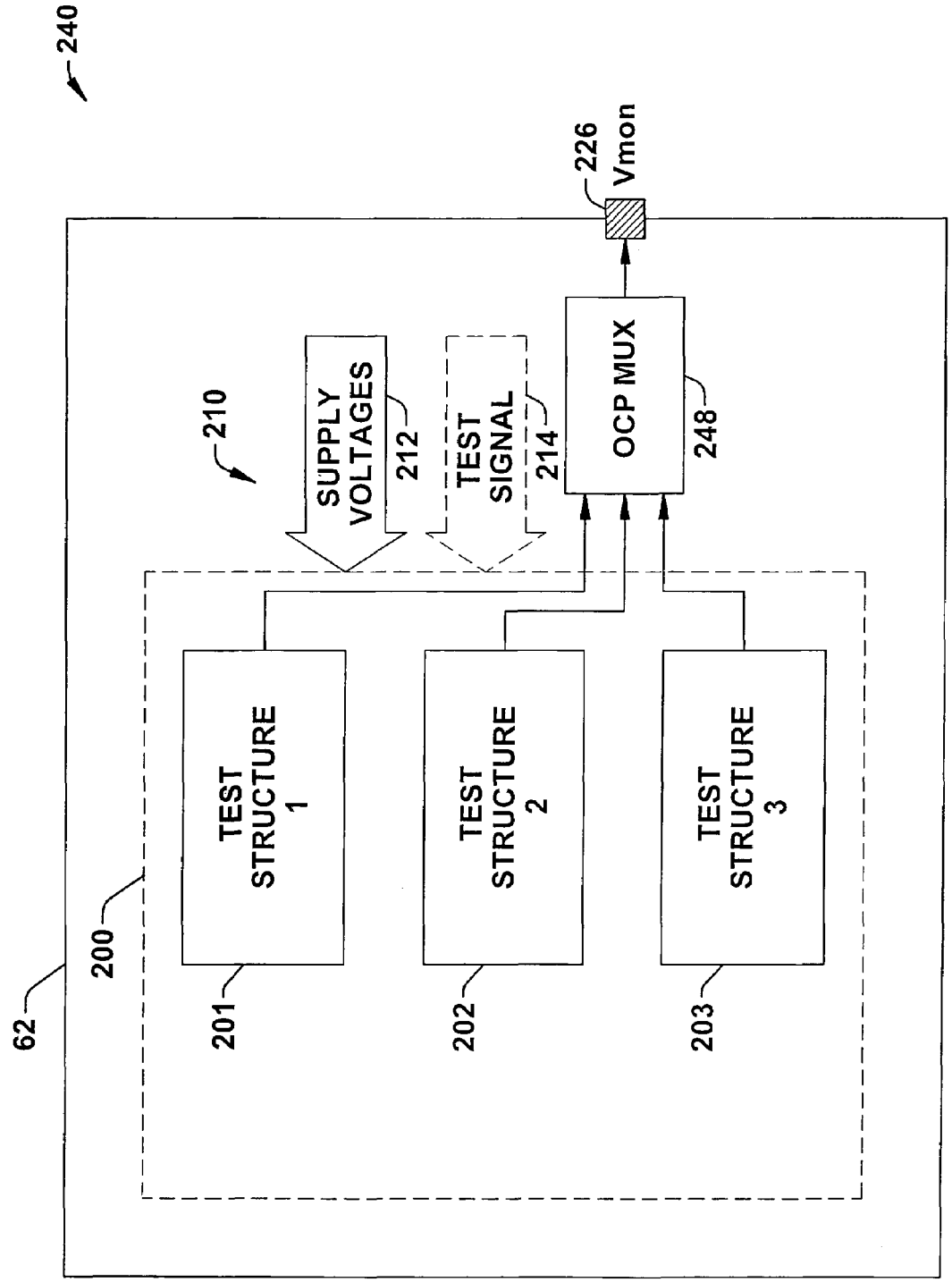

FIGS. 2B and 2C are functional block diagrams of an exemplary set of memory test structures, comprising a plurality of memory structures types, having supply voltages and optionally, test signals applied to select nodes of the test structures, and outputting on-chip parametric measurements for external parametric monitoring, optionally, multiplexed from a single device bond pad or port, according to one or more other aspects of the present invention.

Figures 2D, 2E:
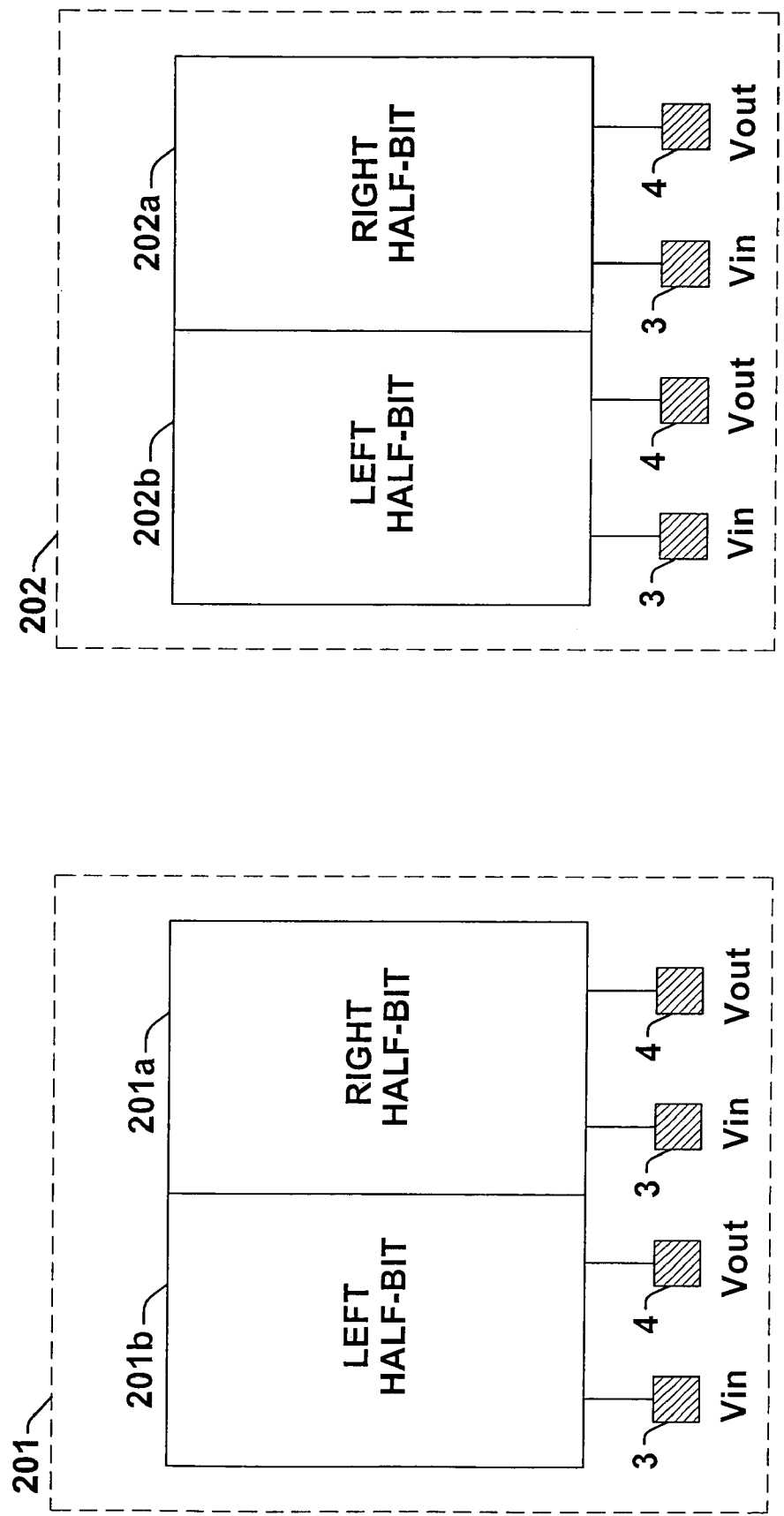

FIGS. 2D and 2E are functional block diagrams of the exemplary first and second memory test structures of FIG. 2A, the memory structures further comprising exemplary left and right memory half-bits, each half-bit having input and output data nodes in accordance with one or more aspects of the present invention.

Figure 3A:
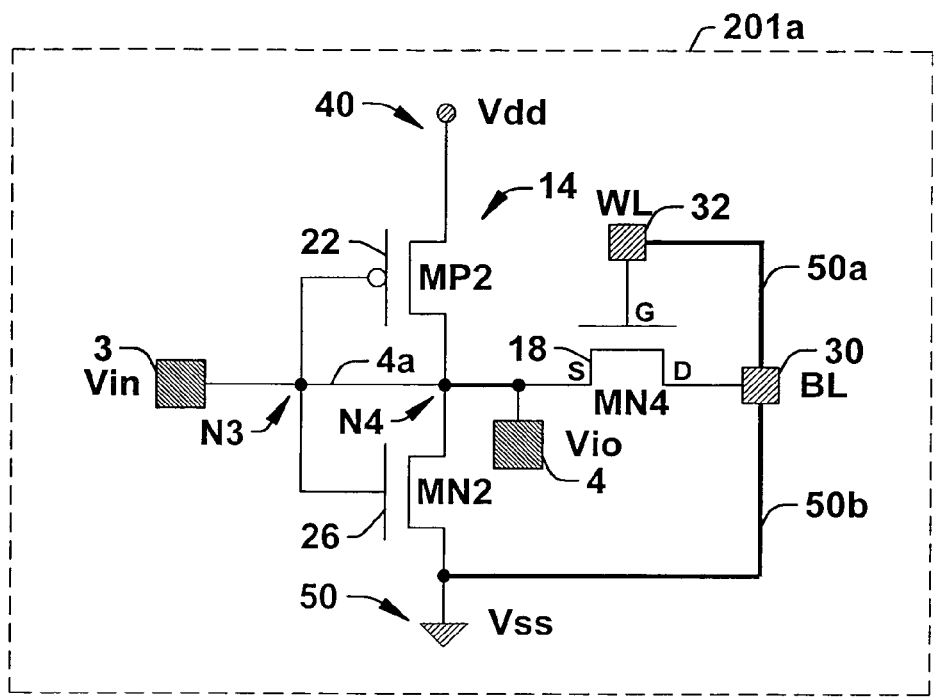

FIG. 3A is a schematic diagram of an exemplary right half-bit structure of a first test structure, similar to the test structure 1 of FIGS. 2A-2D, such as may be utilized in the structures and methods of the present invention for measuring left and right standby SNM voltage values at an output node, the half-bit further illustrating a plurality of circuit nodes for hard-wired interconnection and connection to voltage supply nodes, whereby the test structure may be used to provide at an output node an on-chip parametric measurement (A, or VioR) used for determining SNM in accordance with the present invention.

Figure 3B:
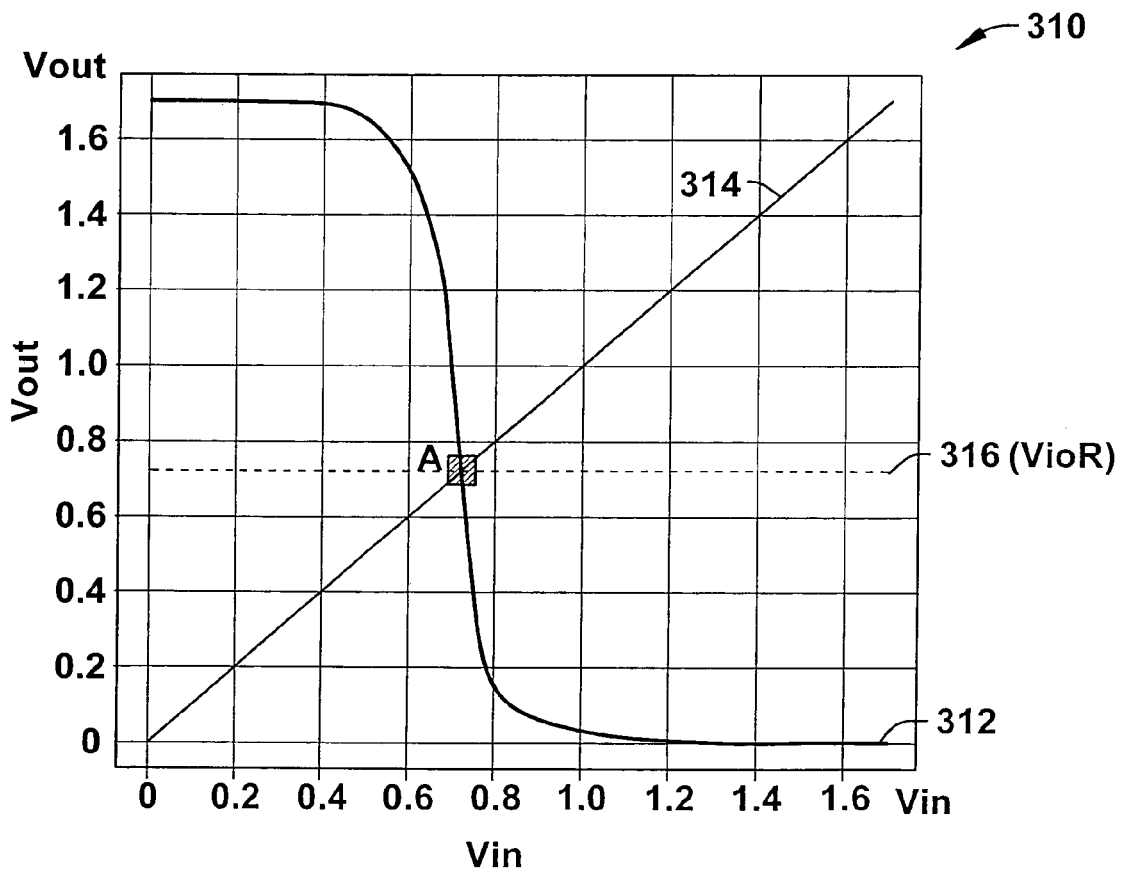

FIG. 3B is a plot of the parametric measurement (A, or VioR), obtained by the right half-bit portion of the first test structure of FIG. 3A used for determining SNM in accordance with the present invention, for context, measurement (A) being superimposed on a conventional VTC plot that may otherwise need to be obtained by post processing of "butterfly curves" in a prior art method.

Figure 3C:
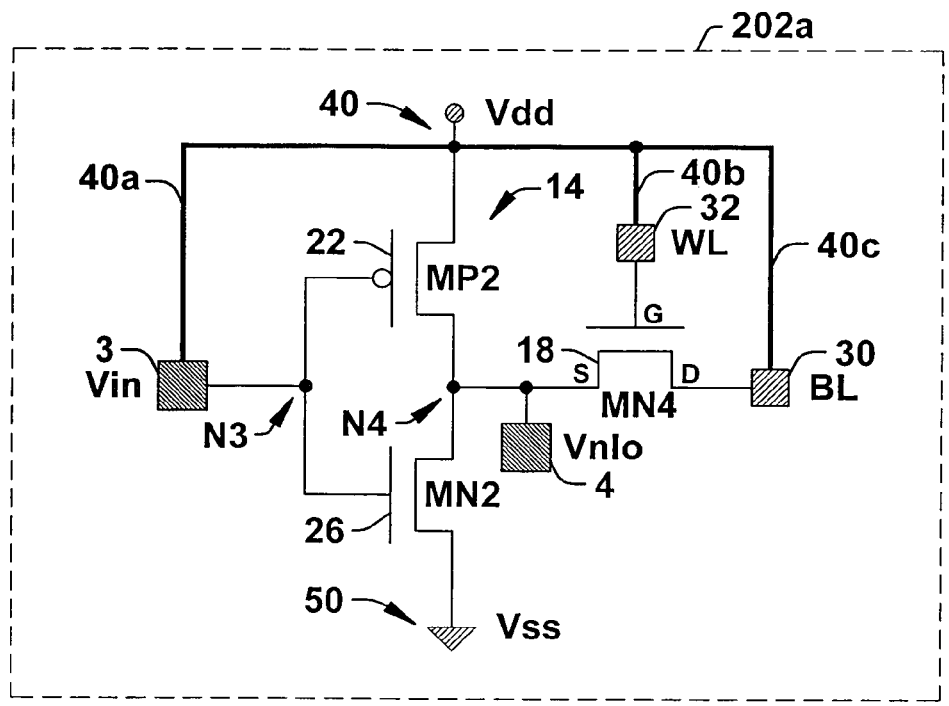

FIG. 3C is a schematic diagram of an exemplary right half-bit structure of a second test structure, such as that of test structure 2 of FIGS. 2A-2C, and 2E, comprising a right half-bit of a 6T SRAM memory cell such as may be utilized in the structures and methods of the present invention for measuring left and right cell ratio voltage values at an output node, the half-bit further illustrating a plurality of circuit nodes for hard-wired interconnection and connection to voltage supply nodes, whereby the test structure may be used to provide at an output node an on-chip parametric measurement (B, or VnloR) used for determining SNM in accordance with the present invention.

Figure 3D:
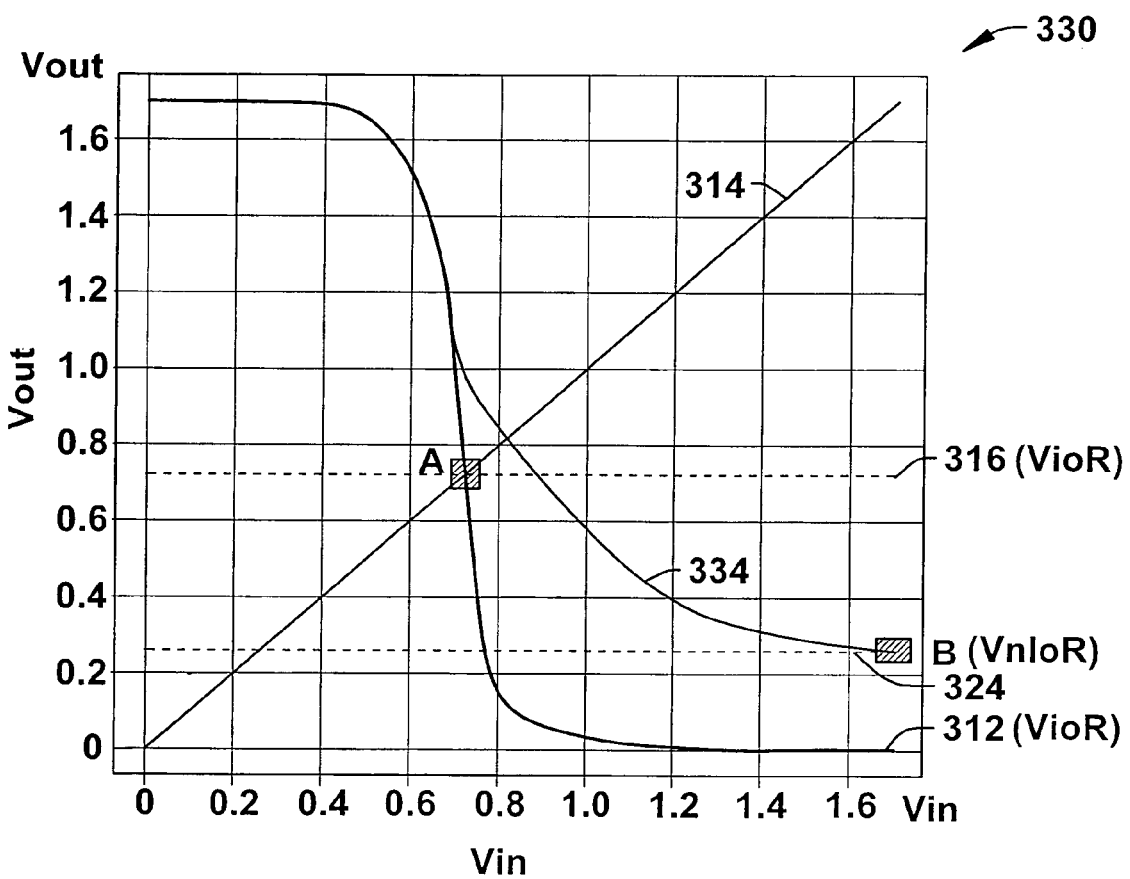

FIG. 3D is a plot of the parametric measurement (B, or VnloR), obtained by the right half-bit portion of the second test structure of FIG. 3A used for determining SNM in accordance with the present invention, for context, measurement (B) being superimposed on a conventional VTC plot that may otherwise need to be obtained by post processing of "butterfly curves" in a prior art method.

Figure 3E:
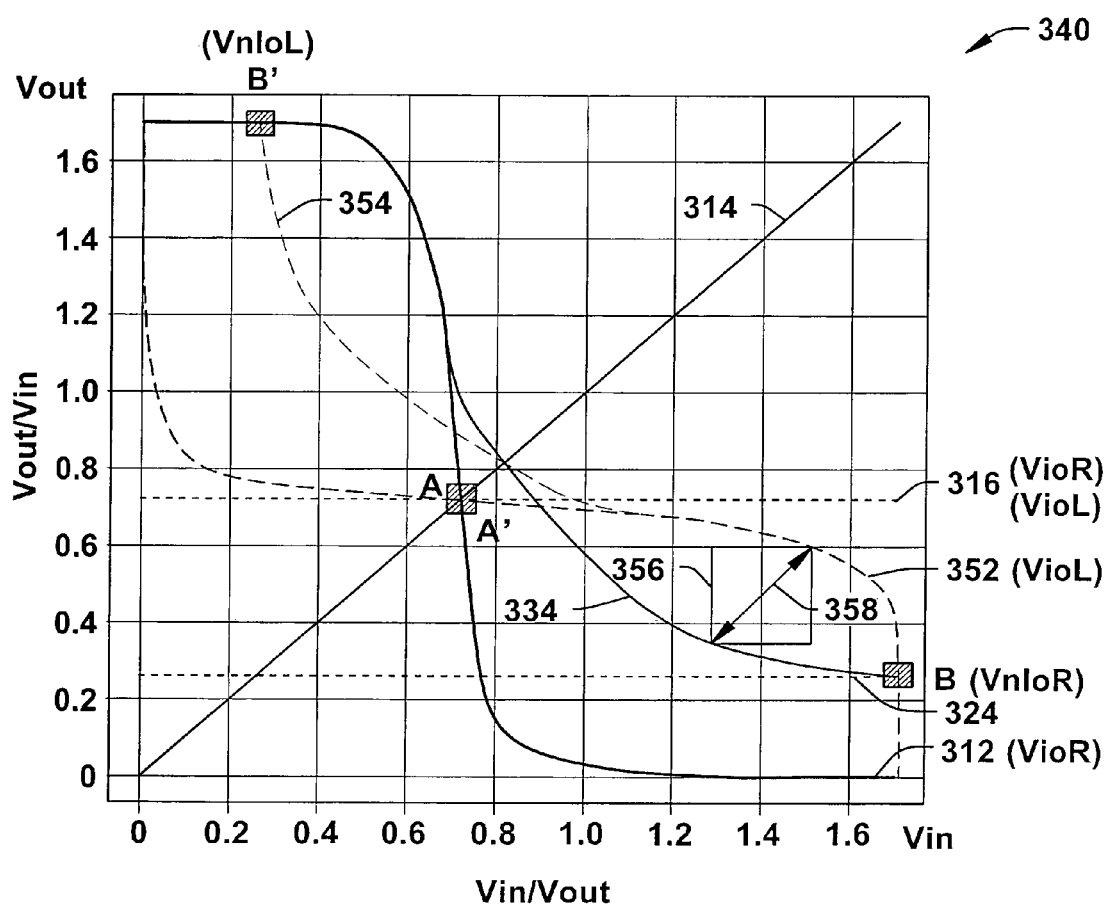

FIG. 3E is a plot of the parametric measurements A (VioR and VioL) and B (VnloR and VnloL), obtained by both respective right and left half-bit portions of the first and second test structures of FIGS. 3A and 3C used for determining SNM in accordance with the present invention, for context, the left and right half-bit measurements A and B being superimposed on conventional VTC plots that may otherwise need to be obtained by post processing of "butterfly curves" in a prior art method.

Figure 4:
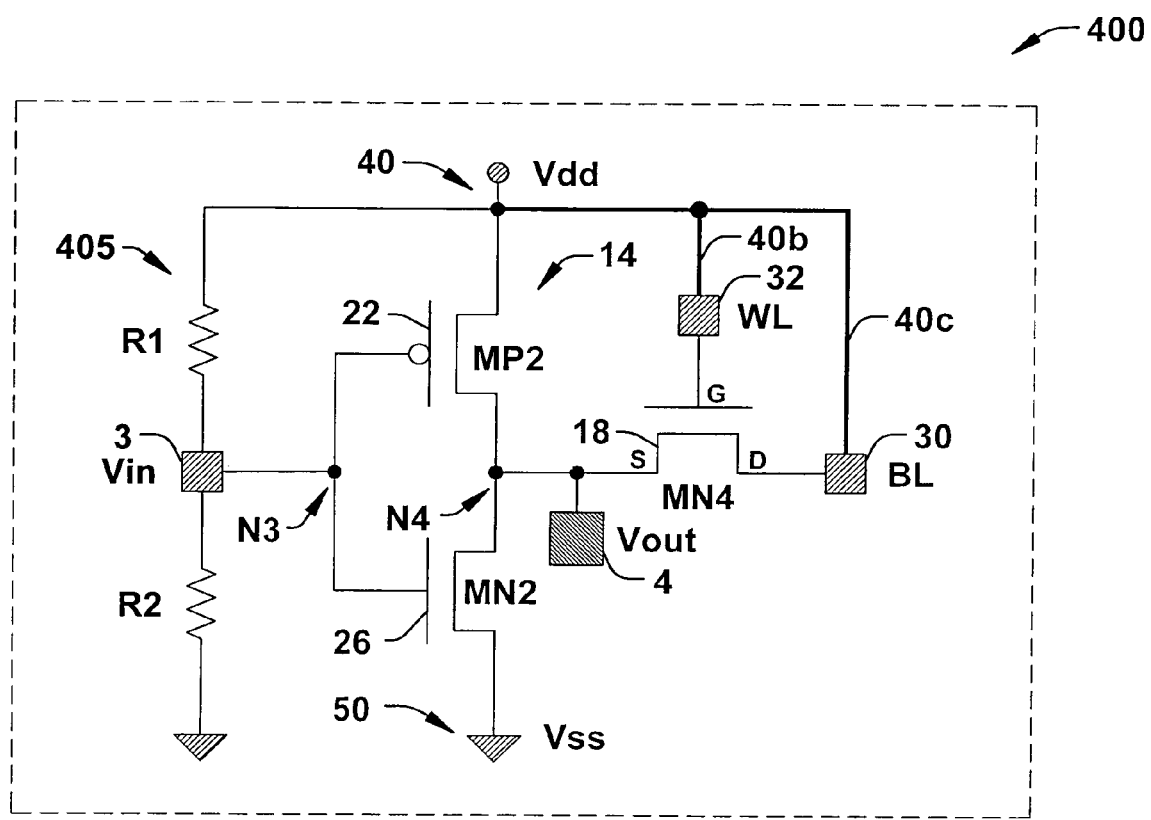

FIG. 4 is a schematic diagram of an optional exemplary threshold test structure, similar to the test structure 2 of FIG. 3C, comprising an additional input voltage divider on the half-bit such as may be utilized in the structures and methods of the present invention to fine tune an active SNM, the half-bit further illustrating a plurality of circuit nodes for hard-wired interconnection and connection to voltage supply nodes in accordance with another aspect of the present invention.

Figure 5:
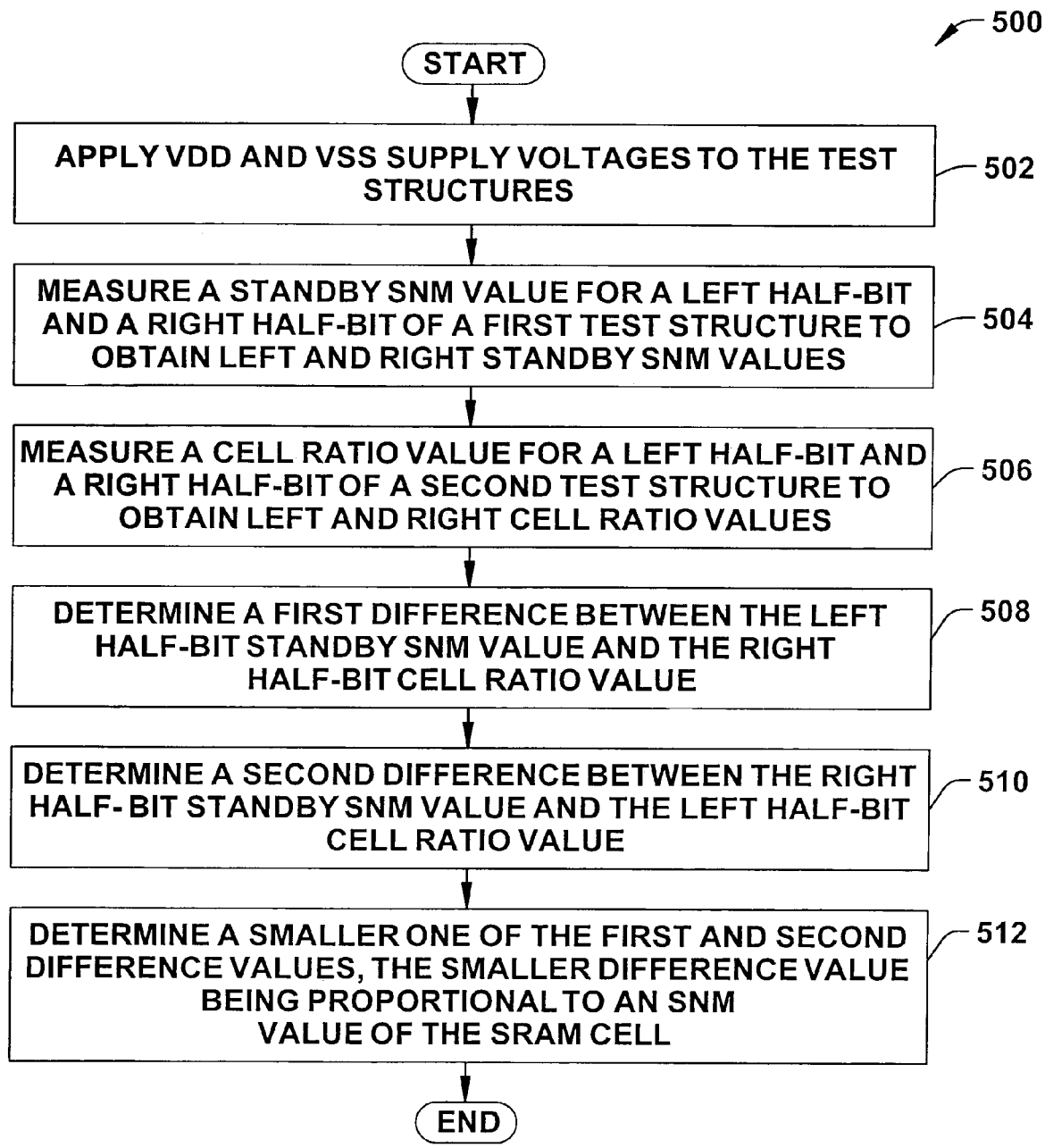

FIG. 5 is a flow diagram illustrating an exemplary method of assessing the SNM of an SRAM cell using a set of two or more memory test structures of a semiconductor or integrated circuit device in accordance with one or more aspects of the present invention.

DETAILED DESCRIPTION OF THE INVENTION

One or more aspects of the present invention are described with reference to the drawings, wherein like reference numerals are generally utilized to refer to like elements throughout, and wherein the various structures are not necessarily drawn to scale. In the following description, for purposes of explanation, numerous specific details are set forth in order to provide a thorough understanding of one or more aspects of the present invention. It may be evident, however, to one skilled in the art that one or more aspects of the present invention may be practiced with a lesser degree of these specific details. In other instances, known structures and devices are shown in block diagram form in order to facilitate describing one or more aspects of the present invention.

The present invention pertains to a set of memory test structures and methods for assessing (e.g., on-chip or at wafer level testing) the memory cells of a semiconductor or integrated circuit device, which provides several discrete parametric measurements from the test structures corresponding to critical points on the VTC curves. These discrete parametric points may then be used to determine a value proportional to the SNM of the cells, for rapid and effective assessment of the SNM of a cell, or an array of such cells, particularly when utilized in static random access memory (SRAM) in accordance with one or more aspects of the present invention.

Conventional testing structures and methods apply signals, monitor, and obtain voltage transfer characteristic (VTCs) to generate "butterfly curves" from one or more memory test structures within an array for the various tests, for example. The butterfly curves are then manually analyzed to determine the approximate SNM of the cells as will be discussed further infra. Such externally derived and applied signals, as well as this conventional testing arrangement limits the usefulness of these measurements for process and SRAM cell development, as well as monitoring, and control purposes, due in part to the capacitive loading of the probe and the associated slowed signal response times.

By contrast, the structures and methods of the present invention benefit from early and massive assessment of SNM of SRAM cells without the time consuming acquisition and post-processing of input-output VTC curves to construct the butterfly curves and derive the SNM for the SRAMs of interest for both on-chip as well as off chip test structures. This technique provides a quantity or value that is proportional to the SNM value sufficient for corrective actions to be taken or decisions to be made on lot movement and assignment of lots for product or process qualification purposes. Because the solution of the present invention does not need external input stimulus applied to the test structures and does not need post data gathering analysis, real-time process correction is permitted and short measurement times may be obtained even under low supply voltage conditions.

In one embodiment of the present invention, the test measurements are performed on a memory test cell which is an integral portion of the set of different test structures, each test structure comprising a left and right half-bit structure that individually provide two parametric data points each. Each left and right half-bit structure comprises hard-wired connections between select input, output, wordline, bitline, and supply nodes (e.g., terminals, ports, test pads or bond pads, device pads or device pins) of the cell to uniquely provide a desired single parametric measurement based on the supply voltage utilized. In addition, unlike another prior art, the structures and technique of the present invention only needs two types of discrete point measurement test structures.

The structures and methods are applicable to various types of memory and memory testing formats wherein a memory test cell, or a plurality of such cells connected in parallel, may be assessed or characterized, representative of one or more cells, for example, of an array of such cells. In addition it is appreciated in the context of the structures and methods of the present invention that multiple supply voltages may be applied to the structures for deriving related additional parametric measurements based on the supply voltages applied.

Exemplary implementations are hereinafter illustrated and described in the context of the fabrication and testing SRAM memory cells or arrays of semiconductor or integrated circuit devices having SRAM memory structures to permit testing and assessment or characterization of the memory cells. The use of a half-bit memory test cell within each structure, which is substantially representative of the cells of a larger array, optimizes the effectiveness of characterizing the cells of the array.

It will be appreciated that the invention may be employed in the fabrication of SRAM memory devices, silicon wafer fabrication and other such fabrication processes in the manufacture of semiconductor or integrated circuit memory devices, and other such structures and methods apart from the exemplary memory structures and methods described and illustrated herein. These and other benefits will become more apparent in association with the discussion of the following figures, wherein the structures illustrated are not necessarily drawn to scale.

Returning to FIGS. 1A, 1B and following, a conventional 6T SRAM cell 1 has been illustrated, wherein some of the prior art testing issues may be described.

Because of the reduced dimensions and the lower operating voltages of current SRAM devices, the prior art externally applied memory testing methods are becoming increasingly inadequate, particularly in embedded memory devices, where many such 6T cells 1 may be used in a larger SRAM array, such as array 52 of FIG. 1C, which is shown for the context of such arrays and embedded memory devices as a prelude to a more in-depth discussion of the problems solved by the invention.

For example, FIG. 1C illustrates an exemplary array 52 of SRAM memory cells 1, similar to the SRAM memory cell 1 of FIGS. 1A and 1B. The memory cells 1 of array 52 are arranged in rows (e.g., Row 1, . . . . Row n) and columns (e.g., Column 1, . . . . Column m) of cells 1. In addition, array 52 has columns (e.g., Column 1, . . . . Column m) of bitlines, for example, BL 30, and BLB 31, and rows of wordlines (e.g., Row 1, . . . . Row n), for example, WL 32. The bitlines BL 30 and BLB 31, are driven with complimentary states by a bitline driver 54 during memory write operations. Core cell 2 of FIG. 1A is electrically powered by the drain supply Vdd 40 and the source supply Vss 50 (e.g., at ground potential). More generally, in a larger array of 6T SRAM cells 1, such as array 52 of FIG. 1C, Vss voltage 50 and Vdd voltage 40 may be supplied via upper metal layers of the array serving as power supply busses.

FIG. 1D illustrates an integrated circuit (IC) 60 (e.g., a semiconductor IC) having an exemplary memory region 62 such as may be used in accordance with the present invention, comprising a memory test cell or an array of memory cells such as the static random access memory (SRAM) cell of FIG. 1A, for example. The integrated circuit 60 further includes a logic and/or control region 64, for processing, logic, or a variety of other such functions in numerous applications wherein the memory (e.g., an embedded memory cell or memory array) may be utilized.

As has been previously discussed, an upset may occur when a cell is accessed, for example, when the word lines for the bit are raised high for either reading from that bit or when writing to another bit on the same row of the memory array but on a different column of that memory array. Further, it has been shown that it is possible to have data corruption without accessing the memory but by simply going into the retention mode. It has also been shown that the SNM of the bit 1 with its word line WL 32 shut off or disabled may be referred to as "standby SNM", herein, and is another important parameter in SRAM design, and that identifying the distribution of SNM of SRAM bits in a product may provide an accurate forecast of the number of single bit failures the product will experience that is related to cell disturb.

Finally, the acquisition and analysis of "butterfly" curves by a prior art method is slow, requires a large number of measurements and a sophisticated SNM extraction algorithm, and introduces probe capacitive loading errors, particularly with the lower supply voltage trends of modern devices. Thus, the technique of the present invention offers a viable alternative method that provides an approximation to SNM, without obtaining VTC curves and the associated post processing problems. Accordingly, the method of the present invention is highly attractive for the test time reduction and for massive data gathering for statistical analysis. The structures and methods of the present invention therefore lend themselves to being placed not only within traditional scribe line structures but also for placement in product chips as well. Such parametric structures that are amenable to being placed on a product chip are also known as On Chip Parametric (OCP) structures.

FIG. 1E illustrates a traditional structure 70 for measuring VTCs, comprising a right half-bit 70 of a conventional SRAM memory cell such as cell 1 of FIG. 1A. Right half-bit structure 70 represents one of the cross-coupled inverters 14 together with a corresponding pass gate. MN4 (18). The half-bit 70 has input data node Vin 3 and output data node Vout 4 used for input and output measurement of the conventional voltage transfer curves (VTCs) that are used for determining SNM in a prior art. Half-bit structure 70 contains half of a bit cell and is made up of a p channel load device (MP1), a pull down device (MN2) and a pass gate or access transistor (MN3). For a given supply voltage (Vdd), the input connection to the half bit (Vin) is voltage swept from 0V to Vdd and the output voltage (Vout) is measured and data logged to produce a VTC.

FIG. 1F illustrates a plot 80 of several conventional voltage transfer characteristics (VTCs) of the half-bit cell 70 of FIG. 1E measured at three supply voltage levels, such as may be used to determine SNM in a prior art. For example, Vin vs. Vout is plotted as a function of supply voltage, where the supply voltage is at about 0.88V for plot 82, about 1.2V for plot 84, and about 1.72V for plot 86.

FIG. 1G illustrates the conventional butter fly curves 90 of the VTCs of the right and left half-bits similar to right half-bit 70 of FIG. 1E, such as may be used to manually determine SNM in a prior art. Identical measurements are made on a first and second half SRAM bit (e.g., left and right half-bit) that form both halves of a full SRAM cell. The second VTCs is then overlaid against the first VTC but mirrored about a 45 degree line 92 relative to the horizontal axis to form the butterfly curve 90 for the cell under test. The SNM calculation algorithm is then applied to find the diagonal lengths of the largest boxes which fit between the two pairs of curves derived from the measurements of the right and left half-bits of the cell. For example, plot 86 represents the VTC plot of the right half-bit of bit 70 of FIG. 1E, while plot 88 represents the VTC plot of a similar left half-bit of the cell. Boxes 94 and 95 are the largest boxes, having diagonal lengths 96 and 98, respectively, which may fit between the two VTC curves 86 and 88.

While, these difficult measurements and algorithms may be utilized in the prior art method by applying the external sweep signals and making numerous measurements, the inventor of the present invention has appreciated that compressed or useful information can be obtained by identifying critical turn points on the plots. In particular, points "a", "c", and "d" can easily be obtained with specially configured half-bit cells, herein identified as test structures, while point "b" on butterfly curve 86 can be approximated from a standby (inverter) VTC measurement. Accordingly, the inventor has further appreciated that the prior art methods are not convenient or suitable for OCP implementations.

By contrast, in the present invention, each of the structures comprise half bit cells that are configured through special connections to appropriate nodes in an array of bit cells that are an exact replica of the array used in the product, with the exception that the array is much smaller in size (number of bits) so that it can fit into a small area in the scribe line, for example.

In accordance with the present method, the half bits (e.g., left and right, or first and second half-bits) of the cells are re-configured into a set of test structures that are different from each other to allow the different critical points on the VTC curves to be measured, for example, points "a", "d", and "c" of FIG. 1G.

FIGS. 2A-2C, illustrate these exemplary sets of memory test structures 200 used to test and characterize cells of the memory array (e.g., memory array 62 of device 60 of FIG. 1D) in accordance with one or more aspects of the present invention.

FIG. 2A, for example, illustrates an exemplary set of memory test structures 200, comprising first 201 and second 202 types of memory test structures 200 having signals 210 comprising supply voltages 212, optionally test signals 214 that are internally applied to select nodes of the test structures, and on-chip parametric measurements which are output from the set of test structures for external parametric monitoring of the structures 200. The parametric measurement signals derived from the test structures are then used to test and characterize cells of the memory array (e.g., memory array 52 of FIG. 1C, or 62 of device 60 of FIG. 1D) in accordance with one or more aspects of the present invention.

Similarly, FIGS. 2B and 2C illustrate exemplary sets of memory test structures 200, comprising a plurality of memory structures types, for example, test structure 1 201, 2 202, 3 203, . . . n 204 having signals 210, comprising supply voltages 212, optionally test signals 214 that are internally applied to select nodes of the test structures, and on-chip parametric measurements which are output from the set of test structures for external parametric monitoring of the structures 200. FIG. 2C, further illustrates that the output parametric monitoring signals may be multiplexed, for example, via OCP mux 248 out to a single device bond pad or port for the external monitoring, according to one or more other aspects of the present invention.

FIGS. 2D and 2E further illustrate the exemplary first and second memory test structures 201 and 202, respectively, of FIGS. 2A, 2B, and 2C, comprising two differently configured types of structures, in accordance with one or more aspects of the present invention. The memory structures 201 and 202, further comprising exemplary first and second or left and right memory half-bits, 201a and 201b, respectively, each half-bit having an input node 3 and an output data node 4. Each of the first and second types of memory test structures 201 and 202, respectively, is configured to generate a different parametric data point measurement, for example, parametric data points similar to points a, d, or c of FIG. 1G, as may be obtained in a prior art using butterfly curves. Exemplary figures will now be illustrated, demonstrating how a memory half-bit may be configured to generate such different parametric data points, useful in the assessment of a value proportional to the SNM of the tested memory cells.

FIG. 3A illustrates an exemplary first right half-bit structure 201a of a first test structure 201, for example, test structure 1 (201) of FIGS. 2A-2D, such as may be utilized in the structures and methods of the present invention. The first test structure 201 is used for measuring left and right standby SNM values at an output node 4. Each half-bit, such as the right half-bit 201a (e.g., or the left half-bit 201b) of the first test structure 201, further illustrates a plurality of circuit nodes that have hard-wired interconnections 4a, and/or supply voltage connections 50a and 50b to supply voltage nodes (e.g., Vss 50), whereby the test structure 201a may be used to generate at an output node 4 an on-chip parametric measurement (A, or VioR) used for determining SNM in accordance with the present invention. For example, hard-wired interconnection 4a shorts the input node Vin 3 to output node Vout 4, and supply voltage connections 50a and 50b short the wordline node WL32 and bitline node BL 30 to source supply node Vss 50, respectively. This particular configuration of the first test structure 201, provides parametric measurement (A, or VioR) as plotted in FIG. 3B, used for determining SNM in accordance with the present invention. In a similar manner, a left half-bit structure 201b, provides a similar parametric point measurement (A', or VioL) as will be shown and described in association with FIG. 3E.

FIG. 3B illustrates a plot 310 of the parametric measurement (A, or VioR), obtained by the right half-bit portion 201a of the first test structure 201 of FIG. 3A used for determining SNM in accordance with the present invention. For context, measurement (A) is shown superimposed on a conventional VTC plot 312 that may otherwise need to be obtained by post processing of "butterfly curves" in a prior art method. As the configuration of the first test structure 201 has the nodes of the input 3 and the output 4 shorted, parametric measurement (A, or VioR) occurs on a 45 degree line 314, wherein Vin 3=Vout 4 at all points on the line, based on the applied supply voltage. With the exemplary applied supply voltage of about 1.72V, parametric measurement (A, or VioR) is shown to occur, in this example at about VioR=0.72V 316. Thus, parametric measurement VioR=Vin 3=Vout 4=0.72V at 316 with this particular configuration.

Alternately, the same result may be obtained as above by shorting the input node Vin 3 to output node Vout 4 and removing the pass gate MN4. Disabling the pass gate by shorting WL 32 and BL 30 to Vss 50 accomplishes the same thing as removing the pass gate MN4.

FIG. 3C illustrates an exemplary second right half-bit structure 202a of a second test structure 202, such as that of test structure 2 (202) of FIGS. 2A-2C, and 2E, such as may be utilized in the structures and methods of the present invention. The second test structure 202 is used for measuring left and right cell ratio values at an output node Vout 4. Each half-bit, such as the right half-bit 202a (e.g., or the left half-bit 202b) of the second test structure 202, further illustrates a plurality of circuit nodes that have hard-wired interconnections, and/or supply voltage connections (e.g., 40a, 40b, and 40c) to supply voltage nodes (e.g., Vdd 40), whereby the test structure 202a may be used to generate at an output node Vout 4 an on-chip parametric measurement (B, or VnloR) used for determining SNM in accordance with the present invention. For example, supply voltage connections 40a, 40b, and 40c short the input Vin 3, the wordline node WL32, and bitline node BL 30, respectively, to the drain voltage supply node Vdd 40. This particular configuration of the second test structure 202, provides parametric measurement (B, or VnloR) as plotted in FIG. 3D, used for determining SNM in accordance with the present invention. In a similar manner, a left half-bit structure 202b, provides a similar parametric point measurement (B', or VnloL) as will be shown and described in association with FIG. 3E, mirrored about the 45 degree line 314 of FIGS. 3B, 3D, and 3E.

FIG. 3D illustrates a plot 330 of the parametric measurement (B, or VnloR), obtained by the right half-bit portion 202a of the second test structure 202 of FIG. 3A used for determining SNM in accordance with the present invention. For context, measurement (B) is shown superimposed on a conventional VTC plot 334 that may otherwise need to be obtained by post processing of "butterfly curves" in a prior art method. As the configuration of the second test structure 202 has the input node Vin 3 tied to Vdd 40, driver transistor MN2 26 will be forced into conduction load transistor MP2 will be turned-off, such that Vout 4 of parametric measurement (B, or VnloR) occurs at a low voltage based on the applied supply voltage. Again, with the applied exemplary supply voltage of about 1.72V, parametric measurement (B, or VnloR) is shown to occur at about VnloR=0.25V at 324 using the configuration of the second test structure 202.

FIG. 3E illustrates a plot 340 of the parametric measurements A VioR, A' VioL, B VnloR, and B' VnloL, obtained by both respective right and left half-bit portions of the first and second test structures of FIGS. 3A and 3C used for determining SNM in accordance with the present invention. For context, the right and left half-bit measurements A or A', and B or B', respectively, are superimposed on conventional VTC plots that may otherwise need to be obtained by post processing of "butterfly curves" in a prior art method. It should be noted that measurement data points A and A' may occur at the same point as shown, thus, the two types of test structures discussed in association with the structures and methods of the present invention may provide three or four parametric data points for SNM assessment of the memory cells.

Thus, from the VTC diagrams 340 of FIG. 3E in one exemplary embodiment of the present invention, it can be seen that a critical point may be obtained at A and A' by shorting the input Vin 3 of the half bit to the output Vout 4 as in FIGS. 3A and 3B. Further, a critical point can be obtained at B and B' using the second configuration formed by shorting the input of the half-bit to the drain supply Vdd 40. In each of these configurations, it can be seen that the requirement for an input stimulus (Vin) has been removed, as it is hard wired to the output Vout 4 or to a supply (e.g., Vss 50, or Vdd 40). This allows a single parametric voltage to be measured at Vout 4 for a given voltage supply. Establishment of these three or four critical points on the VTC allows for SNM to be approximated. For the standby SNM value, in which the pass gates (e.g., MN3 or MN4) are turned off or removed (FIG. 3A, 3B), the critical points are at the well established and known apriori and only the inverter threshold voltage (Vin=Vout) point (Vio) needs to be established. This is accomplished with the hook up shown in FIG. 3A. For the active SNM case, the influence of the pass gate needs to be considered. Hence, two configurations are needed. Configuration 3A provides the half bit threshold voltage (Vin=Vout) while configuration 3C establishes the Vin=Vdd end point (Vnlo).

With these four points, the SNM of the VTC can be approximated. Since these two basic structures do not require an input stimulus and just one voltage to be measured, they can easily be embedded in OCP structures, or may be used in conventional scribe lines. Data gathering may be greatly simplified and decisions on material flow can be made immediately after these point parametric measurements. Many other such test structure arrangements and combinations of structures are possible for any of a variety of different tests or SNM assessment values in the context of the present invention, and as such are anticipated herein.

FIG. 4 illustrates an optional exemplary half-bit threshold test structure 400, similar to test structure 202a of FIG. 3C, comprising an additional input voltage divider 405 on the half-bit such as may be utilized in the structures and methods of the present invention. The threshold test structure 400 may be used to fine tune an active SNM, or without the MN4 passgate, may be used to fine tune the standby SNM curves. As with the first and second test structures, the half-bit further illustrates a plurality of circuit nodes for hard-wired interconnection and/or connection to voltage supply nodes in accordance with another aspect of the present invention.

Thus, in one exemplary embodiment of the present invention as illustrated in FIG. 4, optional additional structures for obtaining information on the threshold transition slope may also be configured to generate points around the threshold voltage. Steep transitions will yield higher SNM values. Transition slopes depend on transistor lambda. However, even without this information, simulations show that the correlation to the SNM of these critical points is higher than those obtained from more conventional measures such as cell ratio (pull down drive current to pass gate drive current ratio), beta ratio (pull down driver current to load transistor drive current ratio), gamma (pull down Vtsat minus the absolute value of load transistor Vtlin), etc. If a finer approximation is needed then additional structures may be added to provide fixed biases at Vin 3 around the Vin=Vout point. One structure may be simply constructed by tying the input Vin 3 to a potential divider 405 to provide a fixed bias as shown in FIG. 4. As more of these structures are added, the VTCs can be reconstructed more accurately. However, the critical data points provided by the first and second structures described above (e.g., test structures 201 and 202) allow a good estimation of bit stability. By contrast to conventional VTC measurements, the structures of the present invention provide short measurement times at very low Vdd supply voltages, because the input voltages are not changing, and test probe needles with high capacitance do not need to be charged at each measurement step as in prior art methods of testing using externally applied signals.

Referring now to FIG. 5, further aspects of the invention relate to a method of assessing the SNM of an SRAM cell or array of such cells of a semiconductor or integrated circuit device such as in an embedded SRAM memory or memory array (e.g., 62 of FIG. 1D) using a set of two or more test structures (e.g., 201 and 202 of FIGS. 2A-2E) of the device. FIG. 5 illustrates an exemplary method 500 in accordance with the invention, and FIGS. 2A-2E illustrate the exemplary set 200 of two or more test structures, for example, first test structure 201 and second test structure 202, the set of structures 200 having signals 210, comprising internally applied supply voltages 212 and optionally, a test signal 214, and having one or more on-chip parametric measurement outputs 216 in accordance with the present invention. While the exemplary method 500 is illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention.

Furthermore, the methods according to the present invention may be implemented in association with the fabrication and/or testing of embedded memory devices, SRAMs, ICs, semiconductor devices, and composite transistors illustrated and described herein, as well as in association with other transistors, devices, and structures not illustrated, including but not limited to NMOS and/or PMOS composite transistors formed in the core region and the logic region of an integrated circuit device, or in the scribe lines of an integrated circuit wafer, for example.

The method 500 begins at 502, wherein supply voltages (e.g., 212 of FIGS. 2A-2C, or 50a, 50b of FIG. 3A, or 40a-40c of FIG. 3B) are applied to the test structures (e.g., 201 and 202 of FIGS. 2A-2E), for example, within a memory (e.g., 62 of FIG. 1D) embedded within an IC 60.

At 504 a standby SNM value for a left half-bit and a right half-bit (e.g., 201a and 201b of FIG. 2D) of a first test structure (e.g., 201 of FIGS. 2A-2D) is measured, for example, at the output nodes (e.g., 4 of FIG. 2D) of the left and right half-bits 201a, 201b, to obtain left and right half-bit standby SNM values, for example, VioL (A) and VioR (A'), respectively, of FIG. 3E.

At 506 a cell ratio value for a left half-bit and a right half-bit (e.g., 202a and 202b of FIG. 2E) of a second test structure (e.g., 202 of FIGS. 2A-2C, and 2E) is measured, for example, at the output nodes (e.g., 4 of FIG. 2E) of the left and right half-bits 202a, 202b, to obtain left and right half-bit cell ratio values, for example, VnloL (B) and VnloR (B'), respectively, of FIG. 3E.

At 508, a first difference between the left half-bit standby SNM value VioL (A) and the right half-bit cell ratio value VnloR (B') is determined. For example, Diff1=(VioL−VnloR).

At 510, a second difference between the right half-bit standby SNM value VioR (A') and the left half-bit cell ratio value VnloL (B') is determined. For example, Diff2=(VioR−VnloL).

Finally, at 512, a smaller one of the first and second difference values is determined (e.g., the minimum of Diff1 and Diff2, the minimum of (VioL−VnloR) and (VioR−VnloL)), the smaller difference value being proportional to an SNM value of the SRAM cell, thereby providing an assessment of the SNM of the SRAM cell or cells of an array, for example, during wafer level testing, BIST testing, or on-chip parametric OCP testing.

The circuits, systems, and methods that have described herein represent examples of implementations of the present invention, and other similar circuits and methods may occur to one skilled in the art, and as such are anticipated in the context of the present invention. Accordingly, the present invention is useful for early and massive on-chip assessment of the static noise margin (SNM) of a static random access memory (SRAM) memory cell or array of such cells of an integrated circuit device without the time consuming acquisition and post processing of voltage transfer "butterfly curves" to derive SNM, but rather by using discrete point measurement structures provided either on-chip or within the scribe lines.

Although the structures of the present invention have been illustrated and described in the context of SRAM memory cells, SRAM arrays, and SRAM cell test structures, other types and styles of memory and non-memory type cells, devices, structures, product structures, and test structures may also be utilized and are anticipated in the present invention, particularly where early, rapid, and massive assessment of the memory cells may be beneficial. Further, although a single test cell has been discussed and illustrated, it is appreciated that two or more such test cell or product cells may be connected or wired in parallel and tested or characterized in the same way as described above to gain an averaging effect of the cell characteristics, and as such is contemplated in the context of the present invention.

Other such cell and transistor technology variations, including cell and array orientation variations are anticipated in the context of the present invention. The invention is also not limited to the use of semiconductor or silicon wafers, and may be implemented in association with the manufacture of various integrated circuit devices, SRAM memory devices, or other such device technologies, wherein the testing, design and optimization of a cell is an issue, and wherein the various aspects thereof may be applied.

Although the invention has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and/or the claims, such terms are intended to be inclusive in a manner similar to the term "comprising."

What is claimed is:

1. A set of test structures used for on-chip assessment of the static noise margin of a memory cell of an integrated circuit device, comprising:
   first and second test structures, individually comprising:
      a memory cell, having one or more half-bits; and
      left and right half-bit test structures, comprising hard-wired connections between select nodes of each memory cell half-bit and one or more voltage supplies applied to the respective half-bit test structures;
   wherein the left and right half-bits of the first test structure are configured for measuring respective left and right standby SNM values at an output node using supply voltages applied to the first test structure during on-chip assessment of the static noise margin of the memory cell;
   and wherein the left and right half-bits of the second test structure are configured for measuring respective left and right cell ratio values at an output node using supply voltages applied to the second test structure during on-chip assessment of the static noise margin of the memory cell of the device.

2. The structures of claim 1, wherein the memory cell comprises one of a flip-flop, a latch, a register, and a storage element.

3. The structures of claim 1, wherein the memory cell comprises an SRAM memory cell.

4. The structures of claim 3, wherein the SRAM memory cell comprises one of a single port, a two port, a dual port, a 6T SRAM, and a multi-port memory cell.

5. The structures of claim 1, further comprising an array of memory cells similar to the memory cell used in the first and second test structures, wherein the test structures are located within the array of memory cells.

6. The structures of claim 1, wherein each half-bit test structure comprises a plurality of nodes, comprising:
   an input node;
   an output node;
   a wordline node;
   a bitline node;
   a source supply node; and
   a drain supply node.

7. The structures of claim 6, wherein the plurality of nodes of the test structures are individually connected to a corresponding one of a plurality of device pads.

8. The structures of claim 7, wherein the plurality of nodes of the test structures are further configured to be controlled by one of a built-in self-test circuit, a device pad, a device pin, and an on-chip parametric testing circuit to individually couple one of the plurality of nodes to the controlling circuit for on-chip assessment of the static noise margin of a memory cell.

9. The structures of claim 6, wherein the output nodes of the test structures are further configured to be multiplexed out to a single output bond pad for external measuring and monitoring purposes.

10. The structures of claim 9, wherein the test structures are located in one of a scribe line of the wafer, a portion of the die that accommodates on-chip parametric testing, a built-in self-test circuit, and a portion of an array of memory cells.

11. The structures of claim 6, wherein the first test structure is configured for measuring left and right standby SNM values within respective left and right half-bits of the first test structure, the configuration comprising shorting the input and output nodes, connecting the wordline and bitline nodes to the source supply node, and configured for measuring the voltage at the output node for the applied source and drain supply voltages.

12. The method of claim 6, wherein the second test structure is configured for measuring the left and right cell ratio values within respective left and right half-bits of the second test structure, the configuration comprising connecting the input, wordline, and bitline nodes to the drain supply node, and configured for measuring the voltage at the output node for the applied source and drain supply voltages.

13. The structures of claim 11, further comprising a threshold test structure configured for measuring a left and right threshold voltage value within respective left and right half-bits of the threshold test structure, the configuration comprising connecting the input node to a voltage divider connected between the drain supply node and the source supply node, and connecting the wordline, and bitline nodes to the drain supply node, and configured for measuring the voltage at the output node for the applied source and drain supply voltages.

14. A set of test structures used for on-chip assessment of the static noise margin of an array of SRAM memory cells of an integrated circuit device, the structures comprising:
   first and second test structures, individually comprising:
      an SRAM memory cell, having one or more half-bits; and
      left and right half-bit test structures, comprising hard-wired connections between select nodes of each memory cell half-bit and one or more voltage supplies applied to the respective half-bit test structure, each half-bit test structure comprising a plurality of nodes, comprising:
         an input node;
         an output node;
         a wordline node;
         a bitline node;
         a source supply node; and
         a drain supply node;
   wherein the left and right half-bits of the first test structure are configured for measuring respective left and right standby SNM values at the output node using supply voltages applied to the first test structure during on-chip assessment of the static noise margin of the memory cell;

and wherein the left and right half-bits of the second test structure are configured for measuring respective left and right cell ratio values at the output node using supply voltages applied to the second test structure during on-chip assessment of the static noise margin of the memory cell of the device.

15. The structures of claim 14, wherein the SRAM memory cell comprises one of a single port, a two port, a dual port, a 6T SRAM, and a multi-port memory cell.

16. The structures of claim 14, wherein the plurality of nodes of the test structures are individually connected to a corresponding one of a plurality of device pads.

17. The structures of claim 16, wherein the plurality of nodes of the test structures are further configured to be controlled by one of a built-in self-test circuit, a device pad, a device pin, and an on-chip parametric testing circuit to individually couple one of the plurality of nodes to the controlling circuit for on-chip assessment of the static noise margin of a memory cell.

18. The structures of claim 14, wherein the output nodes of the test structures are further configured to be multiplexed out to a single output bond pad for external measuring and monitoring purposes.

19. The structures of claim 14, wherein the test structures are located in one of a scribe line of the wafer, a portion of the die that accommodates on-chip parametric testing, a built-in self-test circuit, and a portion of an array of memory cells.

20. The structure of claim 14, wherein the first test structure is configured for measuring left and right standby SNM values within respective left and right half-bits of the first test structure, the configuration comprising shorting the input and output nodes, connecting the wordline and bitline nodes to the source supply node, and measuring the voltage at the output node for the applied source and drain supply voltages.

21. The method of claim 14, wherein the second test structure is configured for measuring the left and right cell ratio values within respective left and right half-bits of the second test structure, the configuration comprising connecting the input, wordline, and bitline nodes to the drain supply node, and measuring the voltage at the output node for the applied source and drain supply voltages.

22. The structures of claim 14, further comprising a threshold test structure configured for measuring a left and right threshold voltage value within respective left and right half-bits of the threshold test structure, the configuration comprising connecting the input node to a voltage divider connected between the drain supply node and the source supply node, and connecting the wordline, and bitline nodes to the drain supply node, and configured for measuring the voltage at the output node for the applied source and drain supply voltages.

23. A method of on-chip assessment of the static noise margin of an SRAM cell using two or more test structures, the method comprising:

applying one or more supply voltages to the test structures, using hard-wired connections between corresponding voltage supplies and select nodes of the test structures;

measuring a standby SNM value for a left half-bit and a right half-bit of a first test structure to obtain left and right standby SNM values;

measuring a cell ratio value for a left half-bit and a right half-bit of a second test structure to obtain left and right cell ratio values;

determining a first difference between the left half-bit standby SNM value and the right half-bit cell ratio value;

determining a second difference between the right half-bit standby SNM value and the left half-bit cell ratio value; and determining a smaller one of the first and second difference values, the smaller difference value being proportional to an SNM value of the SRAM cell.

24. The method of claim 23, wherein applying one or more supply voltages to the test structures, comprises applying source and drain supply voltages to the test structures, using the hard-wired connections between the voltage supplies and select nodes of the test structures.

25. The method of claim 23, wherein the smaller difference value is further proportional to an SRAM bit fail rate of the SRAM cell.

26. The method of claim 23, wherein the SRAM memory cell comprises one cell of an array of SRAM cells.

27. The method of claim 24, wherein each memory cell test structure comprises a left half-bit and a right half-bit, each half-bit further comprising an input node, an output node, a wordline node, a bitline node, a source supply node, and a drain supply node.

28. The method of claim 27, wherein the measuring of the left and right standby SNM values within respective left and right half-bits of the first test structure, comprises shorting the input and output nodes, connecting the wordline and bitline nodes to the source supply node, and measuring the voltage at the output node for the applied source and drain supply voltages.

29. The method of claim 27, wherein the measuring of the left and right cell ratio values within respective left and right half-bits of the second test structure, comprises connecting the input, wordline, and bitline nodes to the drain supply node, and measuring the voltage at the output node for the applied source and drain supply voltages.

* * * * *